(12) United States Patent
Laisne et al.

(10) Patent No.: US 8,384,417 B2
(45) Date of Patent: Feb. 26, 2013

(54) SYSTEMS AND METHODS UTILIZING REDUNDANCY IN SEMICONDUCTOR CHIP INTERCONNECTS

(75) Inventors: Michael Laisne, San Diego, CA (US); Karim Arabi, San Diego, CA (US); Tsvetomir Petrov, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 67 days.

(21) Appl. No.: 12/480,754

(22) Filed: Jun. 9, 2009

(65) Prior Publication Data

US 2010/0060310 A1 Mar. 11, 2010

Related U.S. Application Data

(60) Provisional application No. 61/095,855, filed on Sep. 10, 2008.

(51) Int. Cl.
*H03K 19/003* (2006.01)
(52) U.S. Cl. .......................................... 326/10; 326/16
(58) Field of Classification Search .................. 326/10, 326/14, 15, 41, 47, 37, 101
See application file for complete search history.

(56) References Cited

U.S. PATENT DOCUMENTS

| | | | |
|---|---|---|---|
| 6,651,202 B1 * | 11/2003 | Phan | 714/733 |
| 6,991,947 B1 * | 1/2006 | Gheewala | 438/15 |
| 7,415,640 B1 * | 8/2008 | Zorian et al. | 714/711 |
| 7,577,885 B2 * | 8/2009 | Hasegawa et al. | 714/718 |
| 2004/0129939 A1 | 7/2004 | Matsuo | |
| 2006/0001176 A1 * | 1/2006 | Fukaishi et al. | 257/777 |
| 2006/0118972 A1 | 6/2006 | Baek | |

OTHER PUBLICATIONS

International Search Report—PCT/US2009/055854, International Search Authority—European Patent Office Jan. 14, 2010.
Written Opinion—PCT/ US2009/055854, International Search Authority—European Patent Office Jan. 14, 2010.

* cited by examiner

*Primary Examiner* — Crystal L Hammond
(74) *Attorney, Agent, or Firm* — Michelle Gallardo; Nicholas J. Pauley; Jonathan T. Velasco

(57) ABSTRACT

An integrated circuit, or combination of integrated circuits, has a primary interconnect, a redundant interconnect, and circuitry connecting the primary and redundant interconnects allowing selection of the redundant interconnect to bypass the primary interconnect.

32 Claims, 18 Drawing Sheets

SYSTEMS AND METHODS UTILIZING REDUNDANCY IN SEMICONDUCTOR CHIP INTERCONNECTS

CROSS REFERENCE TO RELATED APPLICATION

This application claims the benefit of U.S. Provisional Patent Application No. 61/095,855 filed Sep. 10, 2008.

TECHNICAL FIELD

The present disclosure generally relates to semiconductor chips and, more specifically, to redundant interconnects in semiconductor chips.

BACKGROUND

Current technology employs stacking semiconductor chips (e.g., microprocessors, digital signal processors, etc.) or arranging the chips side-by-side. Communication between the chips is sometimes achieved by connecting them using bond wires that hang loose outside of the die space of the chips. Other embodiments use Through Silicon Vias (TSVs) instead of, or in addition to, bond wires. Bond wires, TSVs, and the like are generally referred to as "interconnects."

As die stacks use more and more interconnects, issues of failure and yield are presented. For instance, if a failure rate for a particular high-density interconnect is one in one thousand, and there are one thousand of the high-density interconnects in each device, then on average every device should experience an interconnect failure. Such a low yield is generally considered to be unacceptable.

In the area of computer-readable memory, redundant memory cells have been used to ameliorate the problem of failed cells. In some example conventional memory chips, there is a built in self repair facility that tests memory units in the chip for operability. When one or more units are found to be defective, the built in self repair facility "repairs" the chip by directing data that would otherwise be stored in the defective unit to one or more other redundant units. In contrast to the technique used in memory chips, there is currently no effective way to compensate for failures in high-density interconnects.

BRIEF SUMMARY

Various embodiments of the present disclosure include an integrated circuit (IC) that comprise a primary interconnect and a redundant interconnect and circuitry connecting the primary and redundant interconnects allowing selection of the redundant interconnect to bypass the primary interconnect.

In another example, a system includes a primary interconnect and a redundant interconnect, a module testing for operability of the primary interconnect, and circuitry selecting the redundant interconnect. The redundant interconnect is used in parallel with the primary interconnect when a result of the testing indicates operability of the primary interconnect.

In another example, a method includes testing the primary interconnect for operability, through the testing, discerning a failure in the primary interconnect, and selecting the redundant interconnect to reroute a signal path through the redundant interconnect.

In yet another example, a method includes testing the primary interconnect for operability, through the testing, discerning operability of the primary interconnect, and selecting the redundant interconnect to be used in parallel with the primary interconnect. The method can be used in a system that includes a primary interconnect and a redundant interconnect and circuitry connecting the primary and redundant interconnects allowing selection of the redundant interconnect.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Various embodiments of the present disclosure include systems and methods that employ redundancy in interconnects and can be used to compensate for interconnect failure as well as to increase bandwidth. For example, some embodiments employ Through Silicon Vias (TSVs), which are one kind of interconnect. TSVs include conductive vias that extend through the semiconductor material of chips. TSVs can be used in a die stack to provide communication between components in different layers and 3D TSVs can be used in a monolithic manufacturing process to provide communication between stacked layers in the same manufacturing process. One example embodiment uses TSVs for die-to-die communications and, more specifically, uses one or more redundant TSVs to correct defects and/or to improve performance. In this example, when it is discovered post-fabrication that one of the TSVs is defective, signals that would ordinarily be conveyed with that particular TSV can be rerouted through an adjacent TSV and the signals that would ordinarily be conveyed with the adjacent TSV are rerouted to another TSV. This rerouting of signal paths continues down the line of TSVs until the one or more redundant TSVs are used to carry signals. In another example, the signals that would ordinarily be conveyed with the defective TSV are rerouted through the redundant TSV, whether or not the redundant TSV is adjacent to the defective TSV. The redundancy can also be applied to other kinds of interconnects, such as bond wires and routing through redistribution layers (RDLs) of semiconductor dies.

Embodiments are not limited to replacing defective interconnects. In another example, a redundant interconnect is used to convey signals in parallel with a primary interconnect to optimize signal conveyance. Furthermore, if one of the interconnects fails, there is still one other interconnect conveying the signal.

Figure 1:
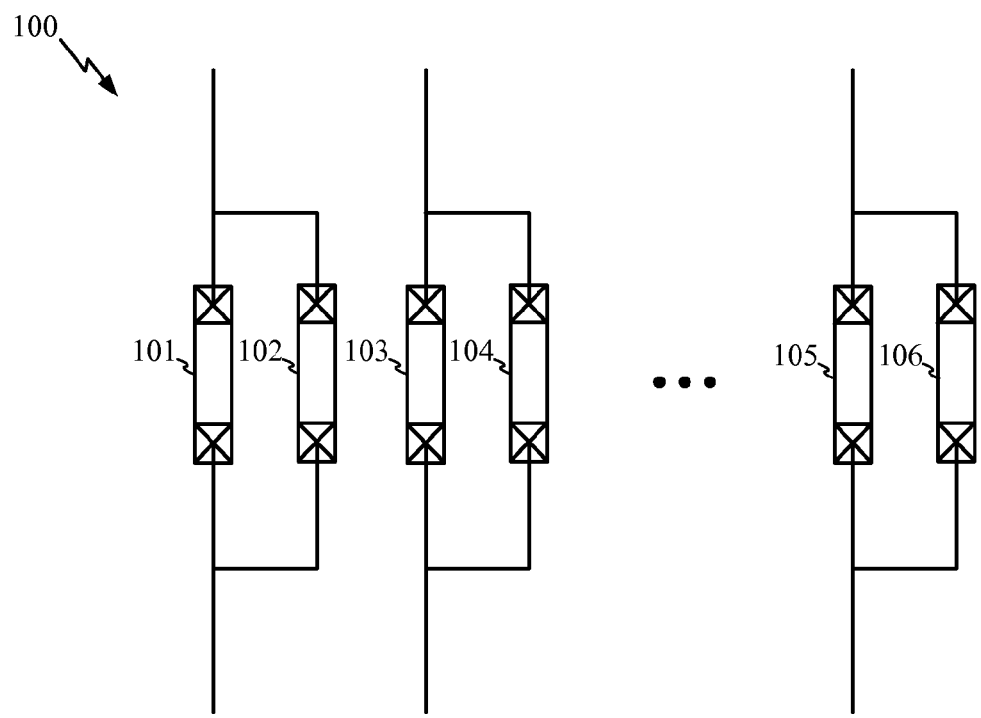
FIG. 1 is an illustration of an exemplary system, adapted according to one embodiment of the disclosure.

FIG. 1 is an illustration of the exemplary system 100, adapted according to one embodiment of the disclosure. The system 100 includes the TSVs 101-106. It should be noted that while the examples illustrated herein show TSVs, the embodiments are not limited to TSVs but can include any type of interconnect, such as bond wires, routing through RDLs, and the like.

The system 100 includes the primary TSVs 101, 103, and 105 and also includes the redundant TSVs 102, 104, and 106. The TSVs 101-106 provide for inter-die communication in a stack of dies, though the dies are not shown for convenience of illustration. The Xs in each of the TSVs 101-106 are contacts, such as solder balls or bumps, and each of the TSVs 101-106 extends through the silicon substrate of at least one die. The system 100 shows 1:1 redundancy, which is merely one redundancy scheme out of many possible redundancy schemes.

Figure 2:
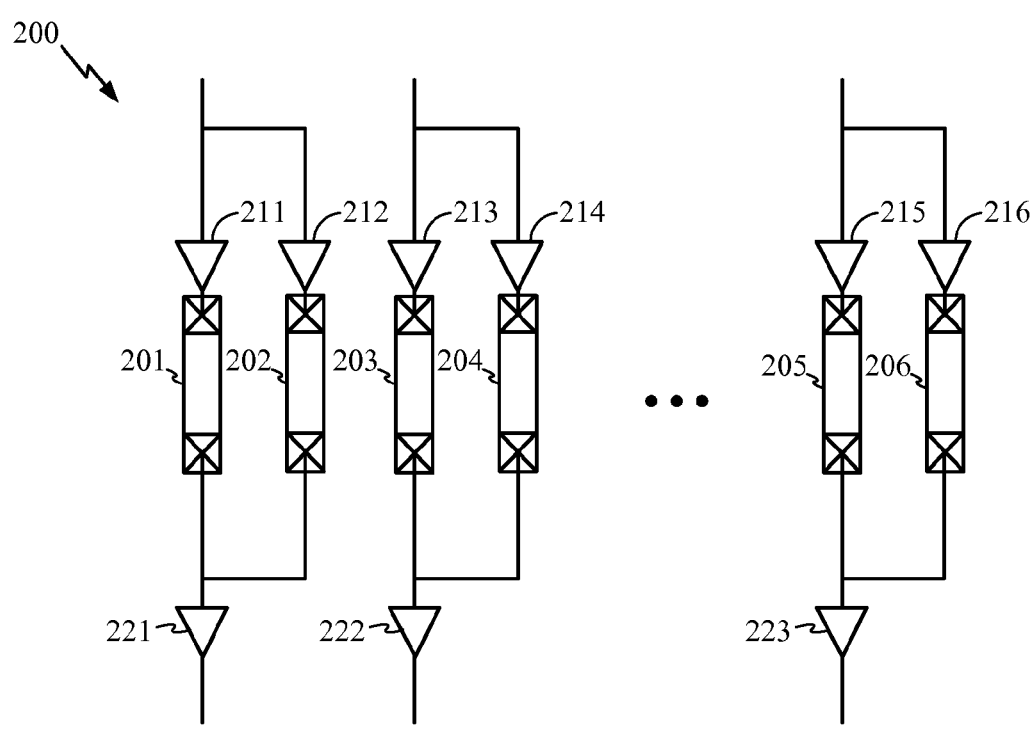
FIG. 2 is an illustration of an exemplary system, adapted according to one embodiment of the disclosure.
Figure 3:
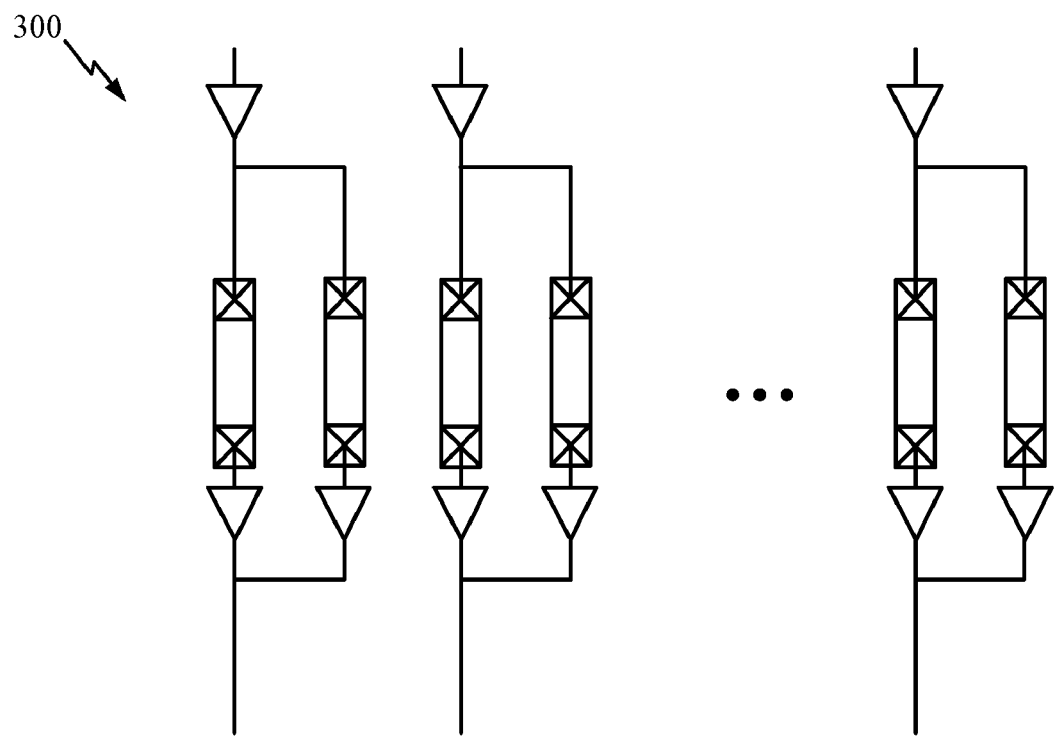
FIG. 3 is an illustration of an exemplary system, adapted according to one embodiment of the disclosure.
Figure 4:
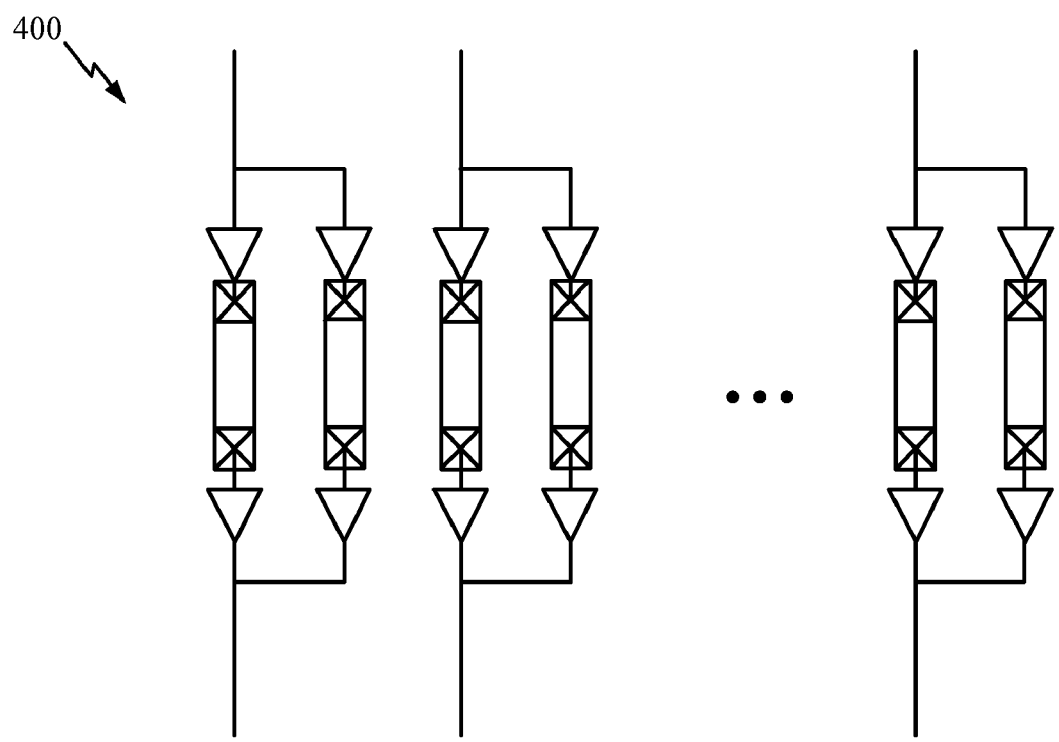
FIG. 4 is an illustration of an exemplary system, adapted according to one embodiment of the disclosure.

FIG. 2 is an illustration of the exemplary system 200, adapted according to one embodiment of the disclosure. The system 200 also has 1:1 redundancy. The system 200 includes the TSVs 201-206. Each of the TSVs 201-206 is driven by a respective driver 211-216, and each pair of TSVs has a respective receiver 221-223. In the system 200, each of the TSVs 201-206 can be driven separately or one driver can be tristated in order to save or reduce power or as part of the redundancy implementation. FIG. 3 is an illustration of an exemplary system 300, adapted according to one embodiment of the disclosure. The system 300 is a single-driver, dual receiver embodiment so that each of the TSVs can be read separately. In this case one receiver can be tristated in order to save or reduce power or as part of the redundancy implementation. FIG. 4 is an illustration of the exemplary system 400 adapted according to one embodiment of the disclosure. The system 400 is a dual-receiver, dual-driver embodiment so that each of the TSVs can be driven and received separately.

Figure 5A:
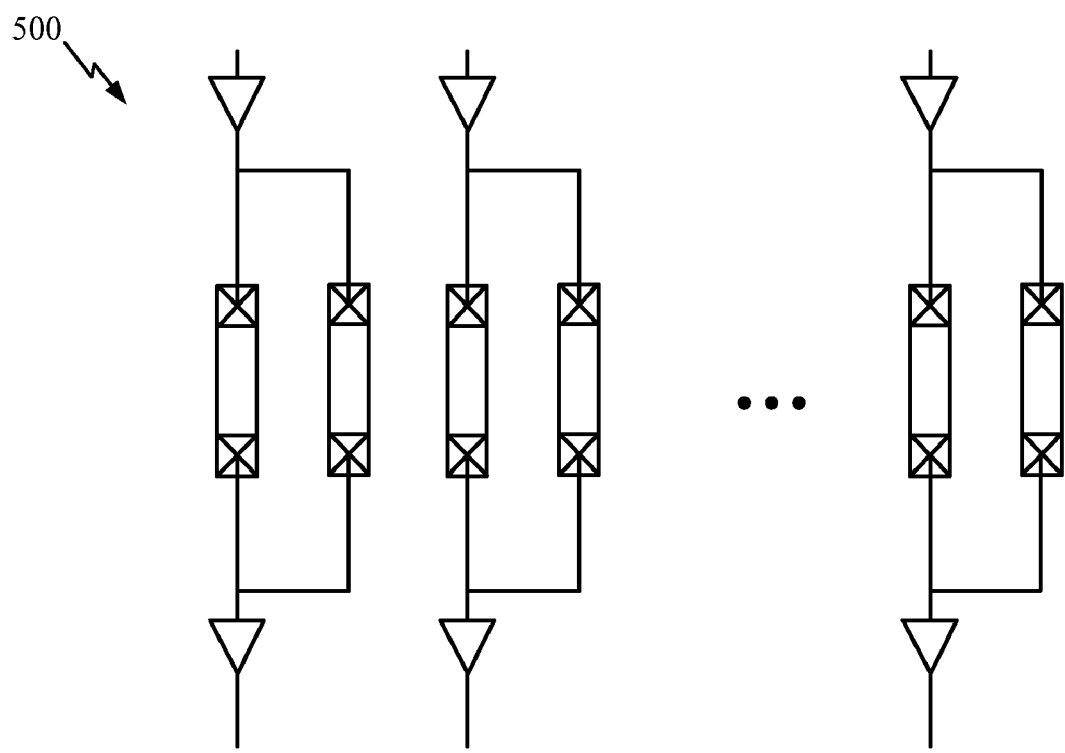
FIGS. 5A and B are illustrations of exemplary systems, adapted according to one embodiment of the disclosure.
Figure 5B:
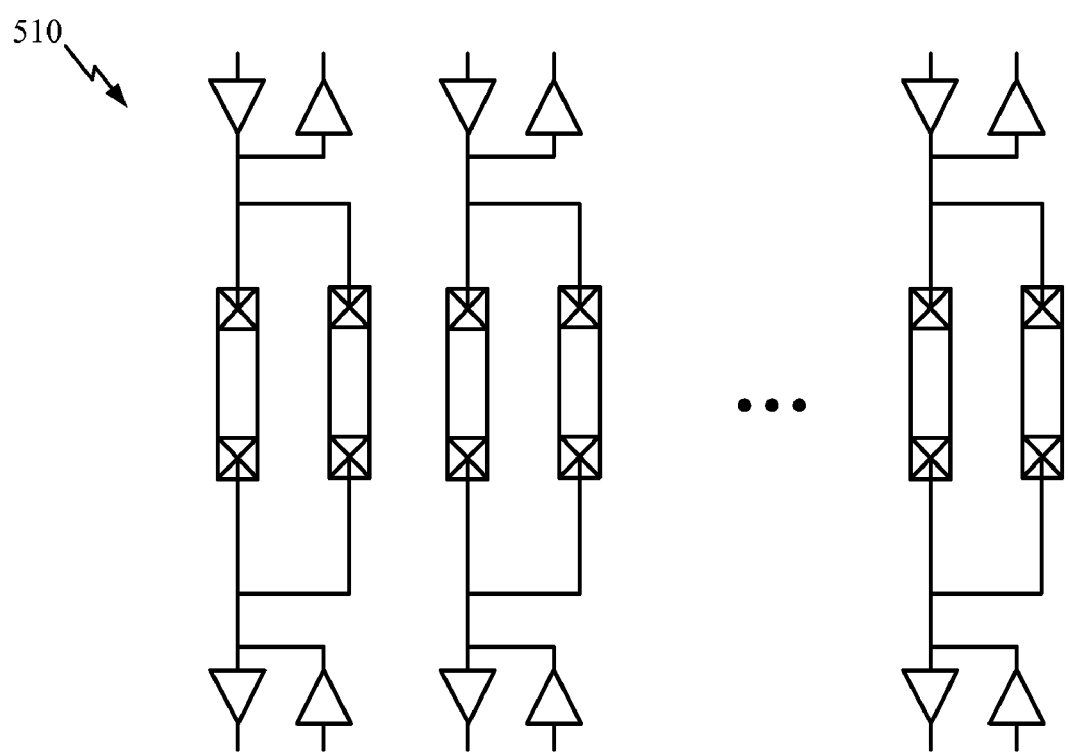

FIG. 5A is an illustration of the exemplary system 500, adapted according to one embodiment of the disclosure. The system 500 shows a single driver and single receiver for each pair of TSVs, so that the only redundancy within each pair is the TSVs. Embodiments of the disclosure can employ any combination of drivers and receivers. While the embodiments of FIGS. 2-5A show a single direction for information for communication of signals, it should be noted that any of the interconnect types herein can be used for bi-directional communication and either direction or any redundant portion thereof can be unused until need or tristated (e.g., an embodiment may use a transistor switch in front of a driver driving the TSV or include a fuse between the driver and the TSV). The system 500 can be alternatively configured such that data can pass in the opposite direction on each TSV or configured such that it may pass bidirectionally, as illustrated in FIG. 5B. Any of the embodiments shown herein can include unidirectional and/or bidirectional components.

Figure 6:
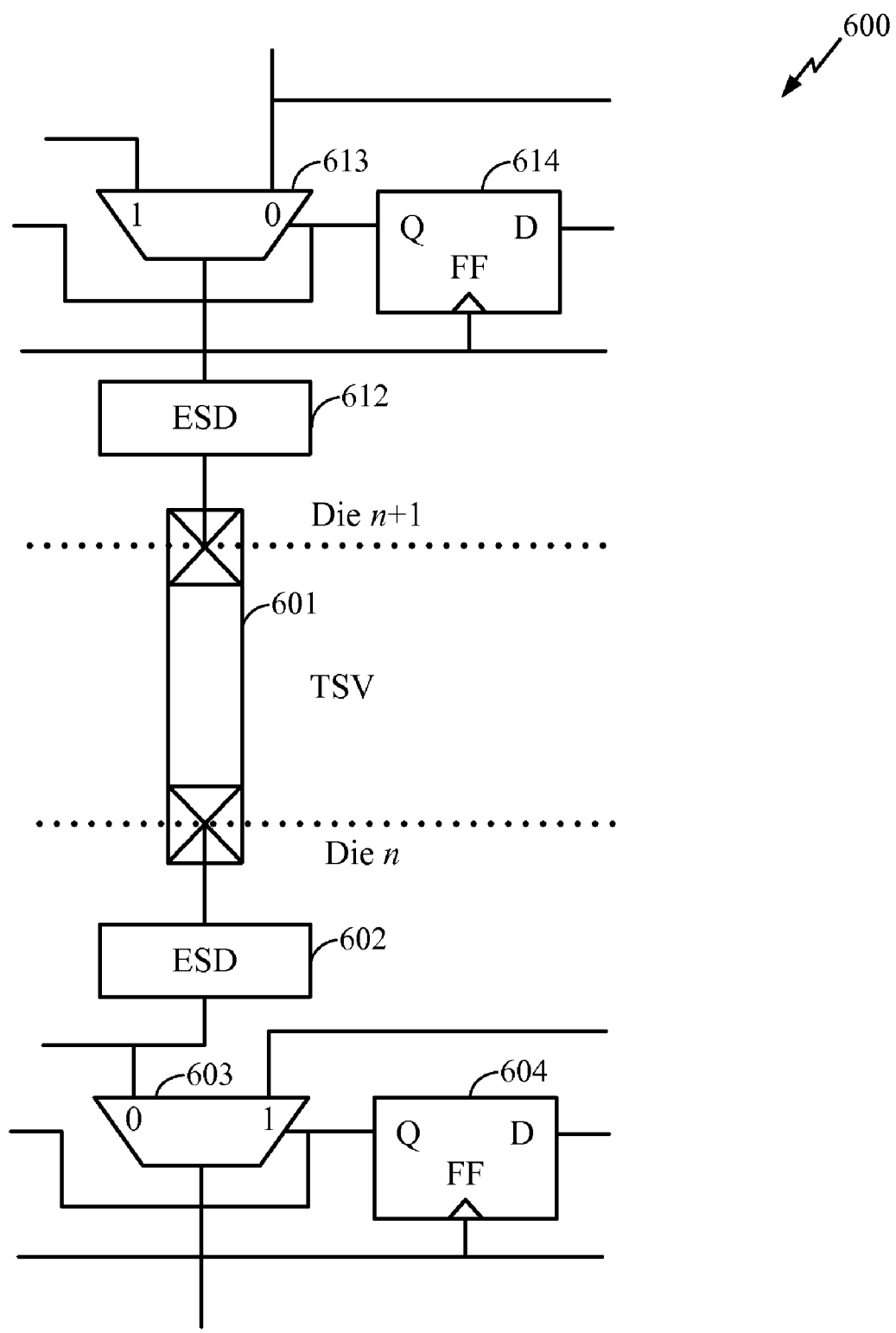
FIG. 6 is an illustration of an exemplary system, adapted according to one embodiment of the disclosure.

FIG. 6 is an illustration of the exemplary system 600, adapted according to one embodiment of the disclosure. While FIG. 6 shows only one TSV (TSV 601), it should be noted that the circuitry of the system 600 is only a portion of the circuitry of a larger system (e.g., the system 800 of FIGS. 8A and B) that includes at least two TSVs and possible additional supporting circuitry. FIG. 6 is shown in order to illustrate circuitry that supports redundancy in a system employing redundant interconnects.

The system 600 includes electrostatic discharge (ESD) structures 602, 612 (which in some embodiments can each be common to multiple interconnects or may be omitted entirely), the multiplexers ("muxes") 603, 613, and the controlling devices 604, 614, which in this case are shown as flip-flops but could include fuses, memory storage elements, or other circuits or devices. In fact, the control for the muxes 603, 613 can be driven directly by an I/O from another device (not shown), stored someplace in RAM or ROM or other memory, or the like. Further, since control structures can be large or costly, their quantity can be minimized by using a combinational logic structure such as decoder, encoder, or direct connection to control the selects of the muxes 603, 613. Such an approach minimizes the number of registers, fuses, or other memory or the like. In short, in this example, a signal path can be created using the muxes 603 and 613, which are controlled, respectively, by controlling devices 604 and 614. In this example, and in the other examples to follow, the ports of the muxes are labeled "0" and "1," and when both of the muxes 603 and 613 are fed a zero, the signal is passed from port 0 of the mux 613, through TSV 601, and through port 0 of the mux 603.

Figure 7:
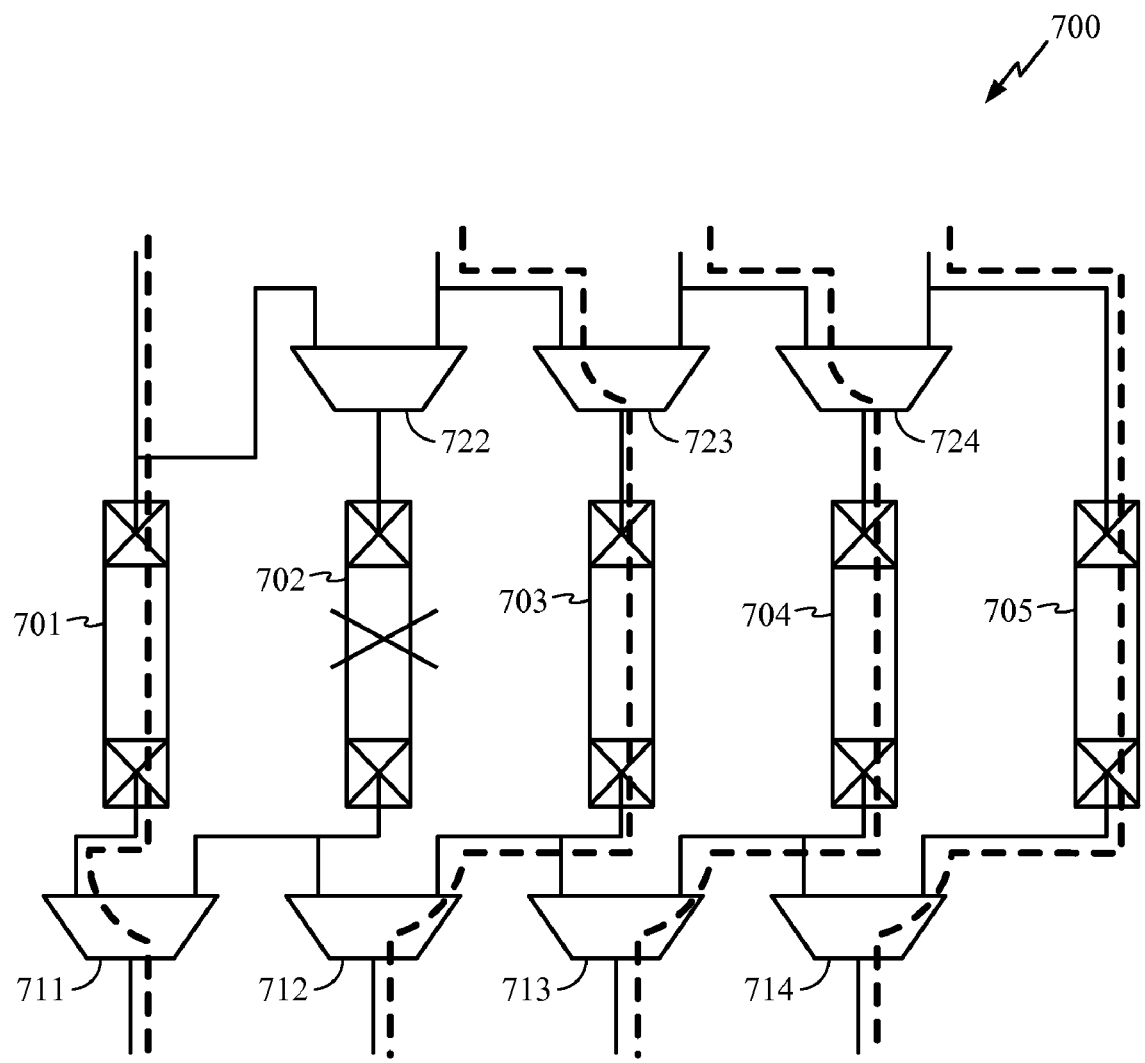
FIG. 7 is an illustration of an exemplary system, adapted according to one embodiment of the disclosure.

FIG. 7 is an illustration of the exemplary system 700, adapted according to one embodiment of the disclosure. The system 700 includes at least two stacked dies, which are not shown for convenience of illustration. The system 700 also includes the TSVs 701-705, where the TSV 705 is a redundant TSV. The system 700 also includes the muxes 711-714 and 722-724, which route signal paths. Although not shown in FIG. 7, it is understood that the muxes 711-714 and 722-724 are controlled by logic, either internal or external to the chip.

In this example, the TSV 702 is defective, as shown by the large "X." The muxes 712-714 and 723-724 are controlled to create signal paths (shown as dashed lines) which bypass the defective TSV 702. TSV 703 carries the signal that would ordinarily go through the TSV 702 but for the failure of the TSV 702. The TSV 704 carries the signal that would ordinarily pass through the TSV 703, and the TSV 705 carries the signal that would ordinarily pass through the TSV 704. This pattern can be referred to as "offset," where the signal paths for the TSVs 702, 703, and 704 are all offset by one place so that the corrective action for the TSV 702 ripples through some of the other TSVs. While not explicitly shown herein, a mux driving TSV 701 can be optionally included to reduce current leakage if the TSV 701 is leaky or shorted. The additional mux can switch TSV 701 to either a high or low state, whichever is desirable to eliminate or minimize the power leakage.

The system 700 has 1:4 redundancy (compared to the 1:1 redundancy in the systems described above). The amount of redundancy used in a particular system can be decided by an engineer based on a number of factors, including cost, expected failure rate, acceptable yield loss, and the like.

Figure 8A:
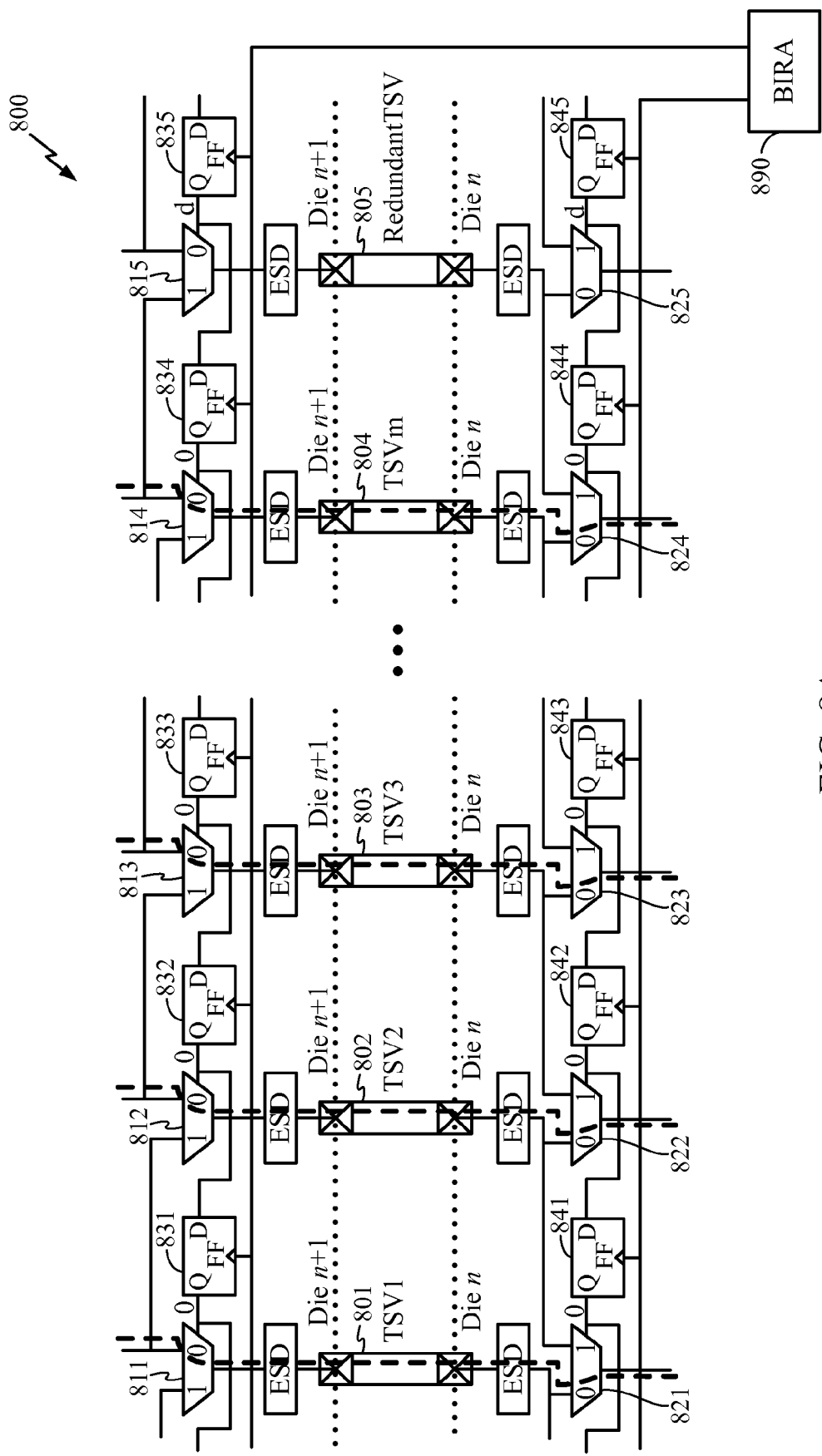
FIGS. 8A and 8B are illustrations of an exemplary system, adapted according to one embodiment of the disclosure.

FIG. 8A is an illustration of the exemplary system 800, adapted according to one embodiment of the disclosure. The system 800 includes the TSVs 801-805, the muxes 811-815 and 821-825, and the controlling components 831-835 and 841-845. In FIG. 8A, all TSVs are operational, and each of the TSVs 801-804 conveys a signal on a respective signal path, as shown in dashed lines. The TSV 805 is a redundant TSV and may either carry no signal or may be used to increase signal bandwidth when redundancy isn't necessary. In an example embodiment, the system 800 can be included in a chip that has a built-in self test (BIST) or built-in self repair (BISR) that is performed periodically or at startup, or built-in redundancy analysis (BIRA) that is performed during manufacturing testing.

Figure 8B:
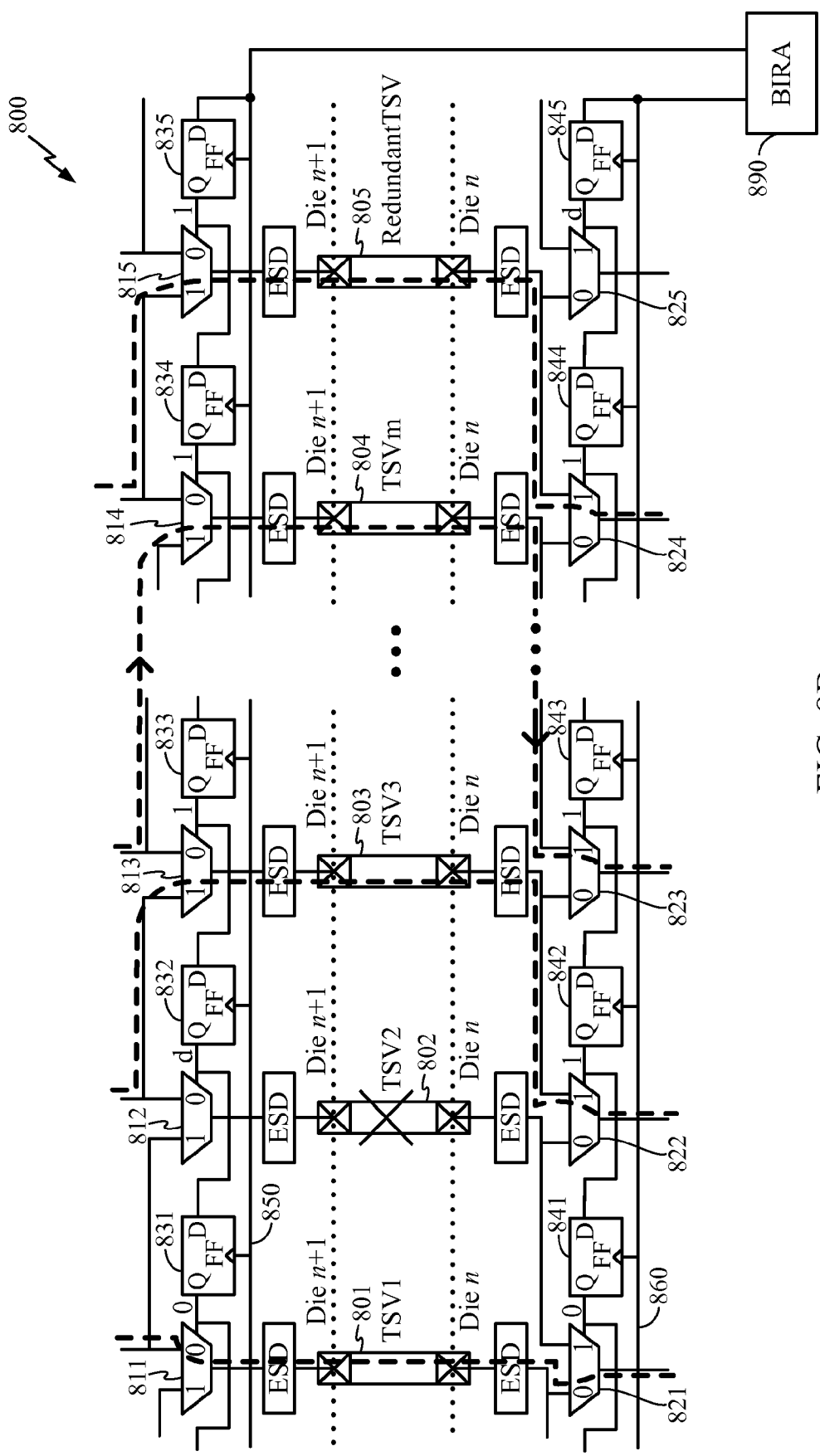

In FIG. 8B, the TSV 802 is determined to be defective (e.g., from testing at startup) and, thus, the system 800 reroutes the signal that would otherwise be conveyed by the TSV 802. The system 800 then configures the controlling components to set the select inputs of the muxes 813-815 and 822-824 to 1, thereby achieving an offset pattern similar to that illustrated in FIG. 7.

In FIG. 8A, the muxes 815 and 825 are shown receiving a signal "d", which is a testing signal. In the case of FIG. 8B, it is determined that the TSV 802 is defective, and the system performs a built-in repair by rerouting the signal paths. The built-in self testing and repair can be controlled by hardware and/or software internal or external to the chip. In this particular example, the control devices 831-835 and 841-845 send control signals to the muxes 811-815 and 821-825. The control devices 831-835 and 841-845 are themselves controlled by signals on the control lines 850 and 860 from Built-In Redundancy Analysis (BIRA) and Built-In Self Repair (BISR) unit 890, which may be a logic device that analyzes failures and controls routing and rerouting of signal paths. Analysis and self-repair tasks can be performed by the same or different units. While the embodiments of FIGS. 8A and B show the control devices 831-835 and 841-845 in a scan chain arrangement, other embodiments may use different arrangements. For instance, as explained in detail below, FIG. 9 shows an embodiment that employs one large mux at the top of the circuit.

Figure 9:
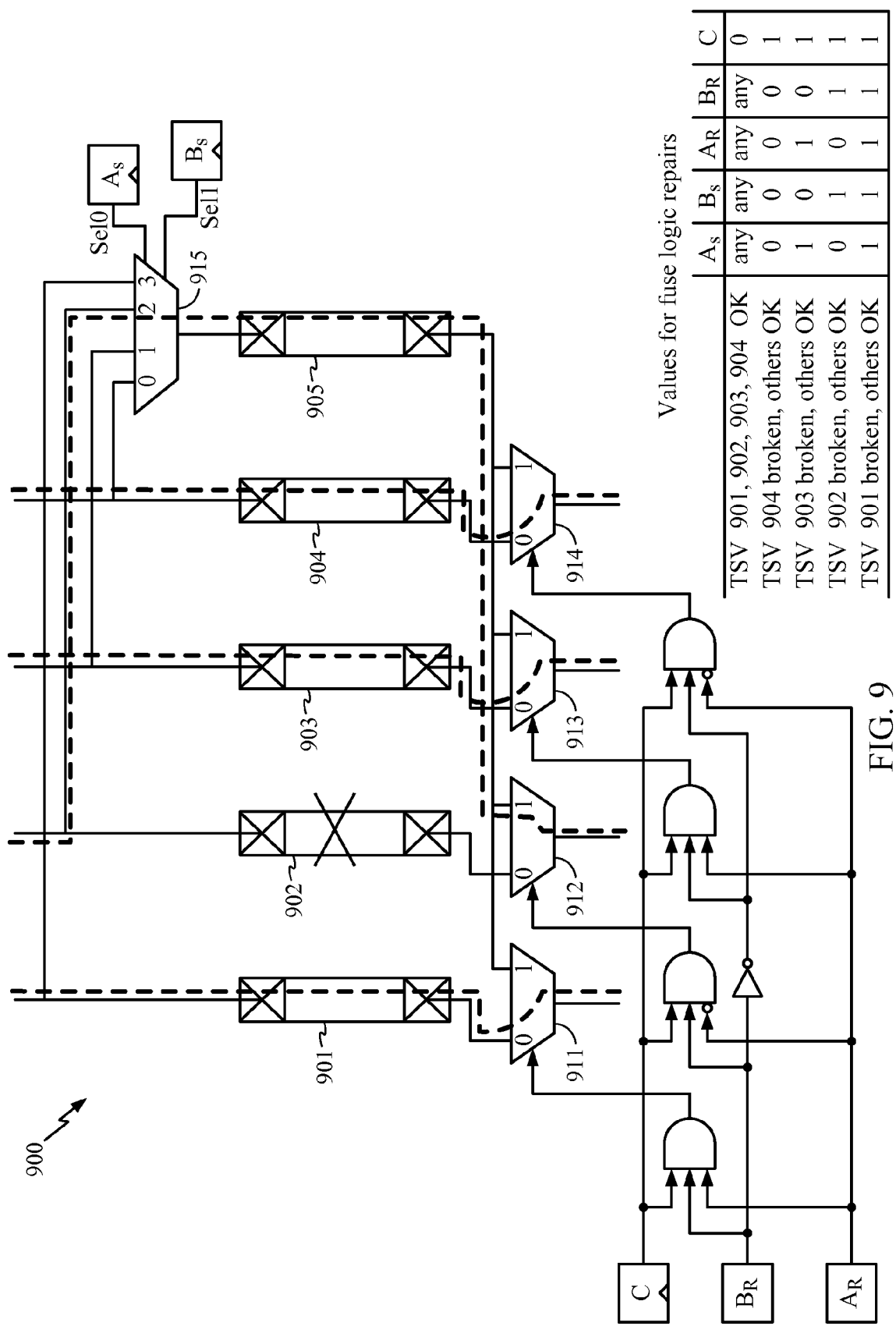
FIG. 9 is an illustration of an exemplary system, adapted according to one embodiment of the disclosure.

FIG. 9 is an illustration of the exemplary system 900, adapted according to one embodiment of the disclosure. The system 900 includes the redundant TSV 905 and a mechanism for bypassing a defective TSV, as described below. The system 900 includes the TSVs 901-905 and the muxes 911-915. In this example, the TSV 902 is defective, and its signal is rerouted through the mux 915, the TSV 905, and the mux 912. Instead of using an offset pattern (as in the system 800 of FIG. 8), the system 900 directly replaces the defective TSV 902 with the redundant TSV 905.

FIG. 9 includes an example implementation of control circuitry, where the state elements $A_R$, $B_R$, and C are connected to the muxes 911-914 through a logic circuit (in this example, a decoder employing AND gates). Example fuse logic for repairing any of the TSVs 901-905 is given in the Table in FIG. 9 as well (i.e., sample settings of the state elements $A_R$, $B_R$, and C in the control circuitry). While FIG. 9 shows a logic circuit employing AND gates, it should be noted that the logic is only one solution out of many possible solutions. Furthermore, other embodiments shown herein can be adapted to use similar control circuitry based on other logic gates. One advantage of combinational logic gates is that they allow decoding which reduces the number of memory elements needed to implement redundancy.

Figure 10:
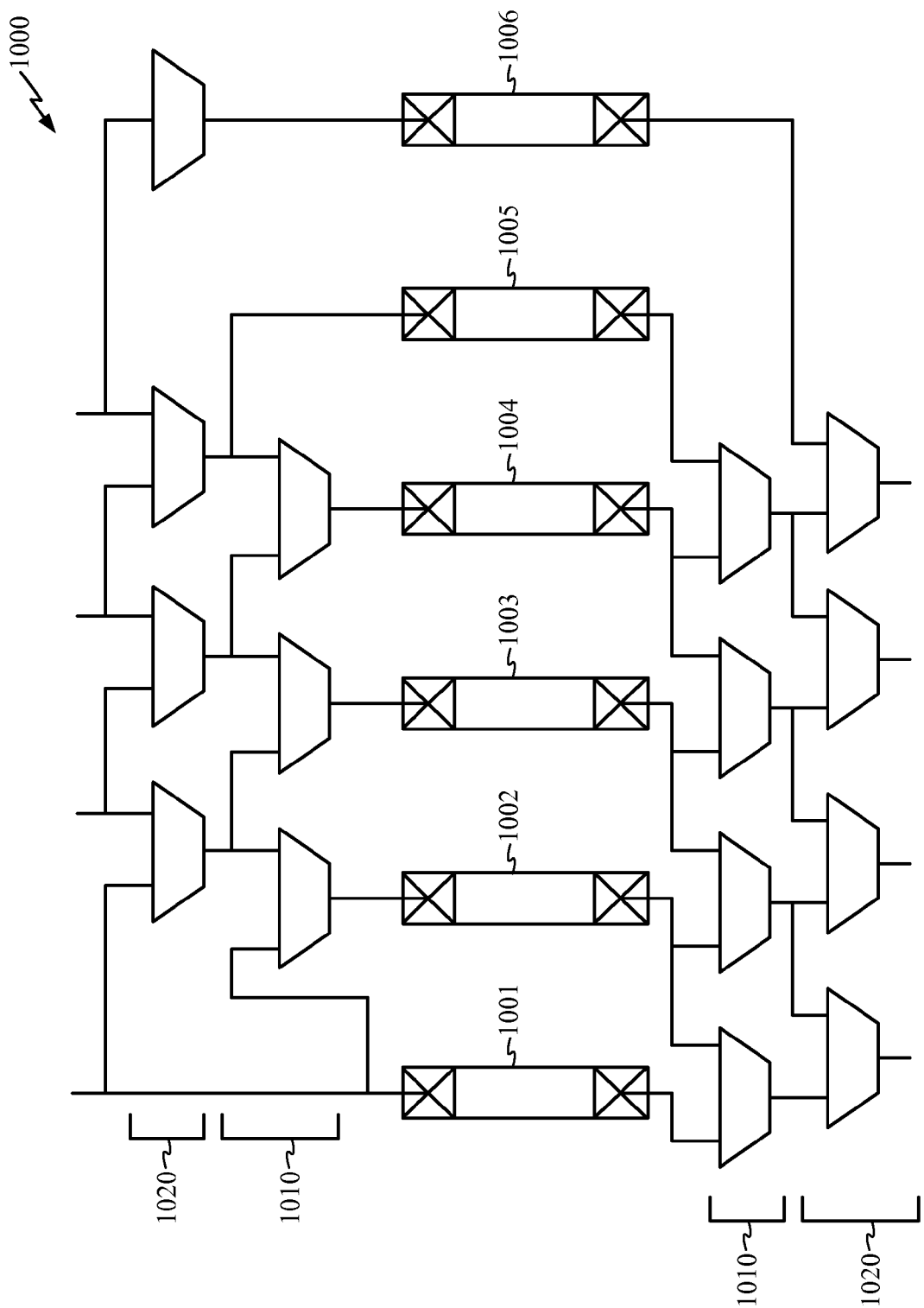
FIG. 10 is an illustration of an exemplary system, adapted according to one embodiment of the disclosure.

FIG. 10 is an illustration of the exemplary system 1000, adapted according to one embodiment of the disclosure. The system 1000 includes TSVs 1001-1004, the two redundant TSVs 1005 and 1006, the first mux layer 1010, and the second mux layer 1020. The first mux layer 1010 can be used to reroute signals to the redundant TSV 1005. The second mux layer 1020 can be used to reroute signals to the redundant TSV 1006. Control components (e.g., flip-flops) are not shown for ease of illustration, but it is understood that the system 1000 of FIG. 10 includes one or more control components the same as or similar to those described with respect to other embodiments (above). While FIG. 10 shows two redundant interconnects and two layers of signal routing, it should be noted that the concept can be scaled to include any number of primary interconnects, redundant interconnects, and corresponding layers of signal routing. If memory elements or fuses contain the locations of the faulty vias (preferably in ascending order with an encoding for no-fault) combinational logic can be used to generate the mux selects or tristate enables according to this rule. Additionally, the layout of the TSVs, vias, or interconnects need not be in a single line. For instance, the layout can be selected from a variety of configurations including a spiral or 2-D array.

Figure 11:
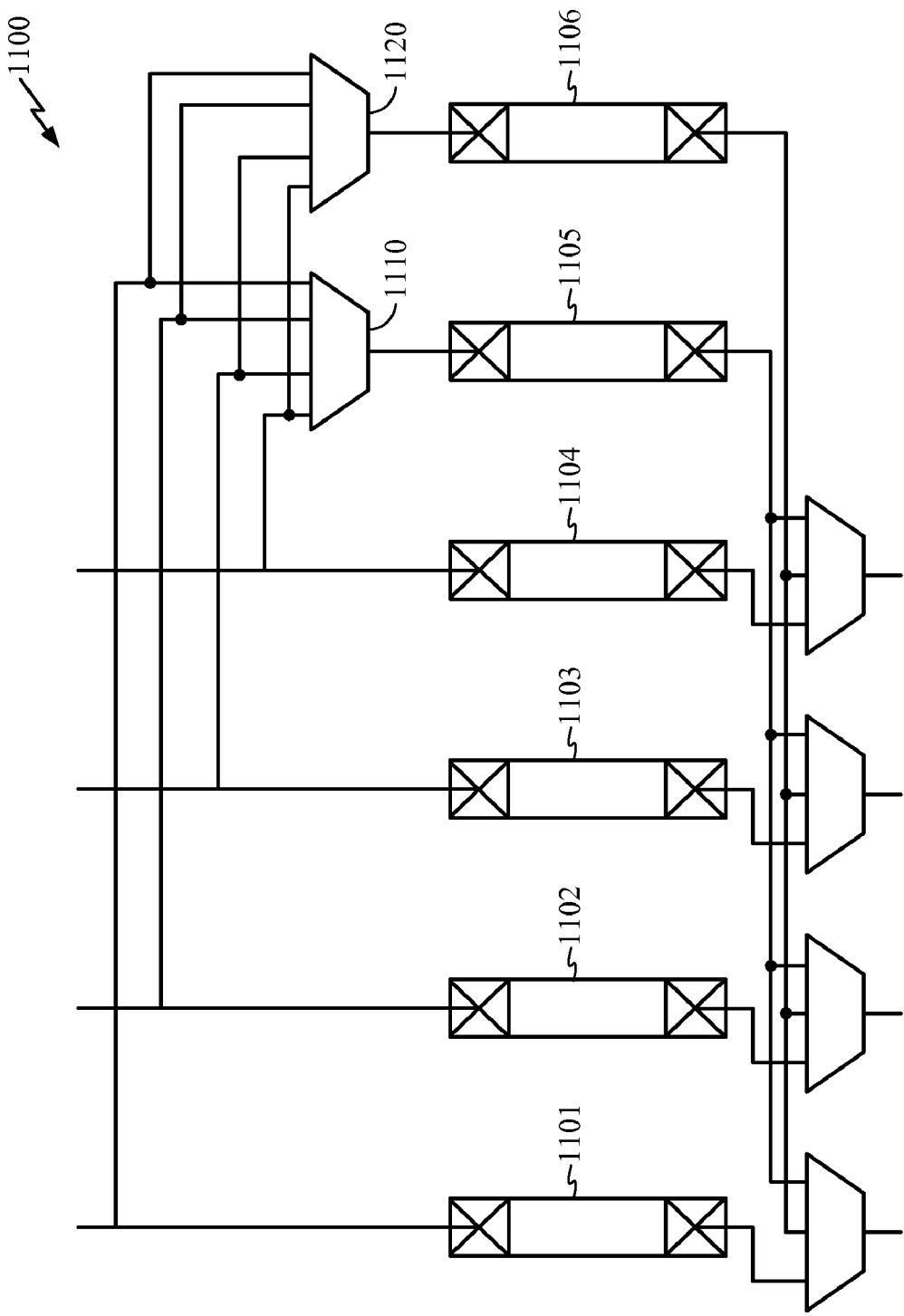
FIG. 11 is an illustration of an exemplary system, adapted according to one embodiment of the disclosure.

FIG. 11 is an illustration of the exemplary system 1100, adapted according to one embodiment of the disclosure. The system 1100 includes the two redundant TSVs 1105 and 1106 and the two signal routing muxes 1110 and 1120. Any one of the TSVs 1101-1104 can be replaced directly with either of the redundant TSVs 1105 and 1106. Once again, FIG. 11 omits control circuitry for ease of illustration, but it is understood that control circuitry (e.g., flip-flops) can be included in the system 1100. Also, the concept can be scaled to include any number of primary interconnects, redundant interconnects and corresponding routing muxes.

Figure 12:
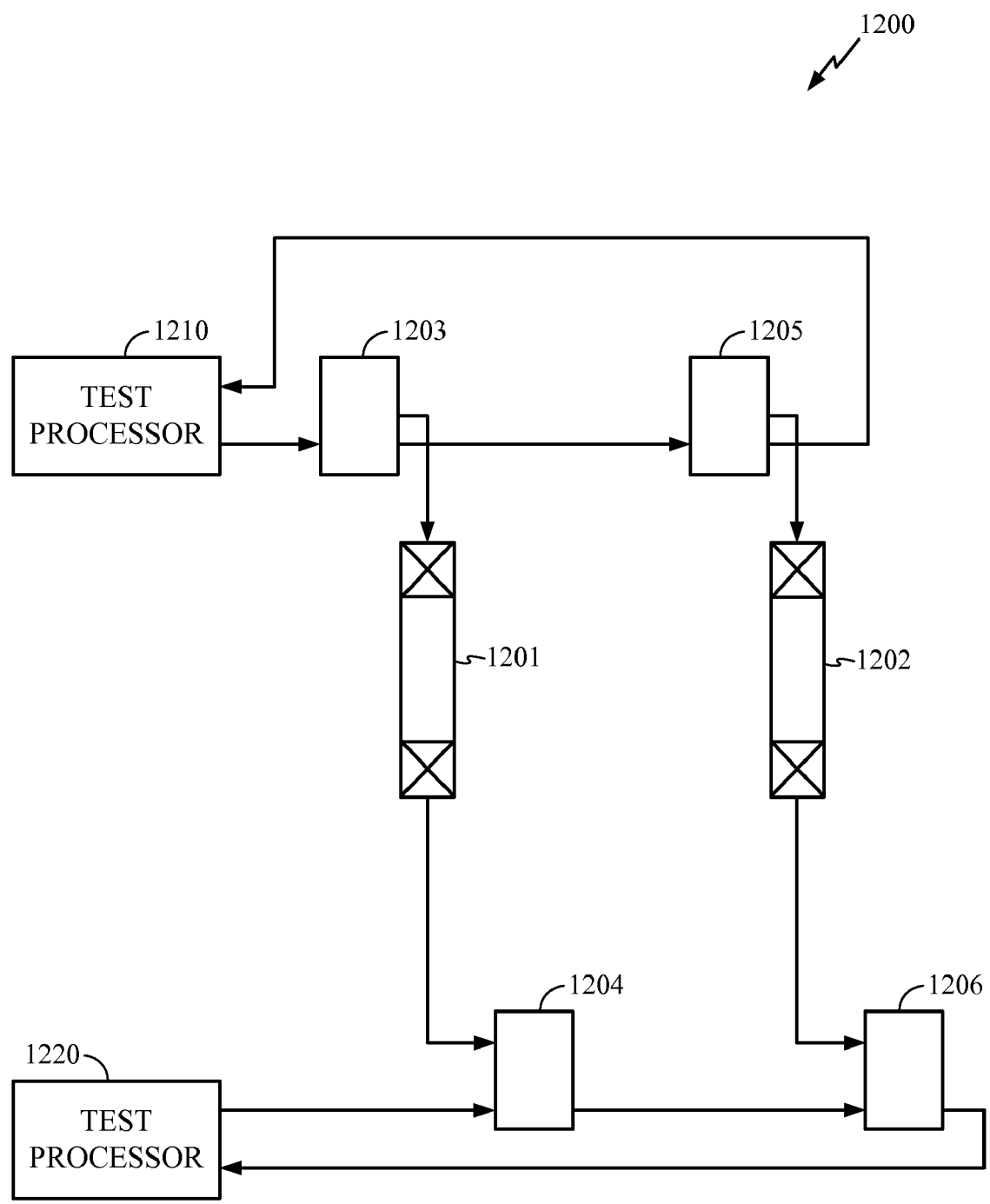
FIG. 12 is an illustration of an exemplary system, adapted according to one embodiment of the disclosure.

FIG. 12 is an illustration of the exemplary system 1200 adapted according to one embodiment of the disclosure. The system 1200 shows a configuration for testing equipment or hardware that can be used by some embodiments to test for defects in interconnects. However, for clarity of illustration other circuitry (such as muxes and flip-flops shown in the embodiments described above), is not shown, but it is understood that such circuitry can be included in various embodiments. The system 1200 includes the TSVs 1201 and 1202. The TSV 1201 is connected to the registers 1203 and 1204, and a signal can be driven from the register 1203 to the register 1204. Similarly, for the TSV 1202, a signal can be driven from the register 1205 to the register 1206. In this example data moves from test processor 1210 to test processor 1220, however, using similar configurations data can be moved from test processor 1220 to test processor 1210 or any combination thereof, including bi-directional data transfer, depending on the processors' 1210, 1220 directional control through the TSVs 1201 and 1202. In this example, a value is driven from the registers 1203 and 1205 to the registers 1204 and 1206 (respectively). The test processor 1220 checks the registers 1204 and 1206 to see if the correct values are stored therein. If the values do not match the interconnect is considered defective, and the signal path is rerouted utilizing a redundant interconnect. ERC (error-correcting codes) may also be used, especially in the most critical high speed and low latency interconnect applications to choose between redundant vias. The system 1200 is shown with two interconnects, but it is understood that the configuration is scalable for a larger number of components. In fact, any of the embodiments shown herein are scalable and adaptable for any of a variety of uses.

The circuit topology in FIG. 12 is not limited to test "equipment", but applies to any testing regardless of whether the source of the stimulus or the destination of the response is equipment, a test processor, a software routine in a general processor, a circuit, an external device, or device within the same package. In one embodiment, test or other critical signals between devices within the same package are connected using the schemes shown in FIGS. 1 through 5, to increase reliability, while the remaining less critical signals use the configurations shown in FIGS. 7 through 11. Non-critical signals may have no redundancy at all.

FIG. 12 shows an embodiment in a shift configuration with a test processor. Other embodiments can be constructed in a parallel configuration and/or using another type of processor, such as a general purpose processor.

Various embodiments of the disclosure include methods for self test and self repair that utilize redundant interconnects. A defect can either be detected by an external device or by an on-board or on-chip error detection unit. Further, a tristate mux implementation may also be used.

One method for driving the interconnect is by using a register cell or a boundary register cell. The Registers 1203-1206 are illustrative of flip-flops, scan flops, or boundary scan registers. Register cells and flip-flops ultimately receive their data from a test unit or other processing unit containing the test algorithm. The register cell or flip-flop can either send a signal to, or receive a signal from, the interconnect depending on its configuration. As shown in FIG. 12, the registers 1203-1206 can also be configured as scan cells, in which case the registers 1203-1206 can be arranged in scan chains, with each scan cell capable of sending data to one or more other scan cells in its scan chain. Thus, all the output register cells on both sides of a die-to-die interface can be loaded with data and then propagated and captured on the other side of the interface. Such process can be performed using any of various configurations, such as through a serial chain, in parallel, or in multiple parallel chains. A parallel approach can be used to save time. As illustrated in FIG. 12, a serial approach can be used to reduce area overhead and simplify the interface to the register cell. The data can be sent either directly or indirectly to the register cell.

A variety of defect detection schemes can be implemented including but not limited to the following schemes. The schemes listed below are conventional techniques that have been used in other applications and can be adapted for use in embodiments of the disclosure. However, the disclosure is not limited to any particular defect detection scheme, as any such scheme now known or later developed can be adapted for use in one or more embodiments.

On-Board Comparison—Expected data can be stored directly in memory or encoded.

Analysis on tester—Data is retrieved from the device and analyzed externally.

ECC—The data is driven across the interface using ECC (Error-Correcting Code). When the data is received it is compared. If a defect is detected the correct data is derived and redundancy is implemented. ECC (error-correcting codes) may also be used in the most critical high speed and low latency interconnect applications to choose between redundant vias. Further, a tristate mux implementation may also be used.

Mirror—Identical data is mirrored on two interconnects or interconnect ports. EDC (Error-Detecting Code) detects a defect on one of them and the other is then used to identify the location of the failing interconnect. The failing interconnect can then be replaced using redundancy.

Voting—Identical data is mirrored on multiple interconnects or interconnect ports. A voting circuit or algorithm detects a defect on one of them. The interconnect with the defect can then be replaced using redundancy.

When a defect is detected its nature is evaluated by the detection circuitry or algorithm, and, if appropriate, a correction circuit or algorithm is signaled with the relevant information required to implement the redundancy. A variety of redundancy schemes along with combinational logic structures such as decoders, encoders, or direct connections can be implemented, including but not limited to:

Real time—Upon startup or at any point during operation the interconnect can be checked and redundancy implemented.

E-fuse—An e-fuse (electronic fuse) can be used to permanently select a redundant interconnect or interconnects.

Laser fuse—A laser fuse can be used to permanently select a redundant interconnect or interconnects.

Registered non-fuse—A register or other memory element can be used to temporarily select a redundant interconnect or interconnects. This approach is shown for a single TSV interconnect in FIG. 6 and for multiple TSV interconnects in FIGS. 8A and B. This technique would typically be part of a real time detection and implementation process. The circuitry surrounding the redundant interconnect 805 in FIGS. 8A and B allows for testing of the redundant fuse. For testability purposes it is recommended that this or a similar non-fuse means for testing the redundant fuse be used regardless of the redundancy scheme implementation. If the application supports it and there is no defect present, the circuitry surrounding the redundant interconnect 805 may be used as part of normal operation allowing for the transmission of additional data between the two tiers. If a defect does occur, the implementation of redundancy would then result in a small performance degradation, though all signal paths would be operable. The "d" signal of control components 835 and 845 of FIG. 8A are set to 0 to enable either test or improved performance if no defect exists. In FIG. 8B a defect is shown on one of the high density interconnects. After testing determines the location of the defect the BIRA/BISR unit 890 (or an internal or external processor with a BIRA and/or BISA algorithm) loads the registers associated with control components, to reroute the signal path around the defective interconnect. Further, in the case where the TSVs are carrying data to and from a memory, memory column redundancy and/or increased RAM bandwidth can be achieved if each RAM data input and output port is connected to a TSV with repair capability. RAM redundancy can be achieved by implementing the redundant TSV channels for each port such that any defective memory columns are replaced with the redundant data input and output TSVs. More complex connections are also covered. Another benefit is that smaller and faster RAMs are achievable since no additional redundant column swap hardware is necessary in some embodiments. Thus, either TSV defects, RAM column failures, or a mixture of both can be tolerated using the identical redundancy hardware. This concept can be further extended to other circuit elements to extend redundancy to those as well. Such elements include but are not limited to logic, analog, or high speed interfaces.

There are a variety of techniques to reroute a signal path around a defective interconnect. One example is direct replacement, where a given interconnect can be swapped with a redundant interconnect. This concept is shown in FIGS. 9 and 11. When a defect occurs, as is shown in FIGS. 9 and 11, redundancy allows the data to be rerouted. In FIGS. 9 and 11, the dashed lines show how the data is rerouted to avoid the defective interconnect. Thus, in FIG. 9, a single defective interconnect is removed from the data path and a redundant interconnect is enabled. In FIG. 11, two defective interconnects can be removed from the data path and a redundant interconnect can be enabled for each. This concept can be extended to any number of interconnects.

Another example is an offset technique, as shown in FIGS. 7 and 10. The neighboring interconnects are replaced one with another. These would typically be done in groups of inputs, outputs, or bidirectionals. When a defect occurs, redundancy allows the data to be rerouted. In the case of FIG. 7, the dashed lines show how the data is rerouted to avoid the defective interconnect. The alternate path is selected in the top right most muxes and the lower rightmost muxes. Thus, the connections are offset and the redundant interconnect is enabled, avoiding the defective interconnect.

A variety of other rerouting techniques are possible in various embodiments, including, but not limited to:

Input only—A given interconnect and its associated receiver can be swapped with a redundant receiver. For example, this might be implemented to replace a receiver damaged by an electrical overstress (EOS) event.

Output only—A given interconnect and its associated driver can be swapped with a redundant driver. For example, this might be implemented to replace a driver damaged by an EOS event.

Bidirectional—A given interconnect and its associated driver and receiver can be swapped with a redundant driver and receiver. For example, this might be implemented to replace a driver and receiver damaged by an EOS event.

Tristatable—A given interconnect and its associated tristatable driver can be swapped with a driver. This can be done for both output only and bidirectional configurations. The test controller may further turn off any tristatable driver to further reduce or control power. A tristatable approach may be implemented to isolate a TSV damaged by an EOS event from the rest of the circuit.

Various embodiments use redundant regions of interconnects. If there is a failure in a given primary region, a redundant region can then be used to replace the given primary region. Types of regions include, but are not limited to: rows, columns, arrays, chains, blocks, and any combination thereof. Arrangements using redundant a redundant row, a redundant column, and a redundant block are shown in FIGS. 13, 14, and 15 as examples.

Figure 13:
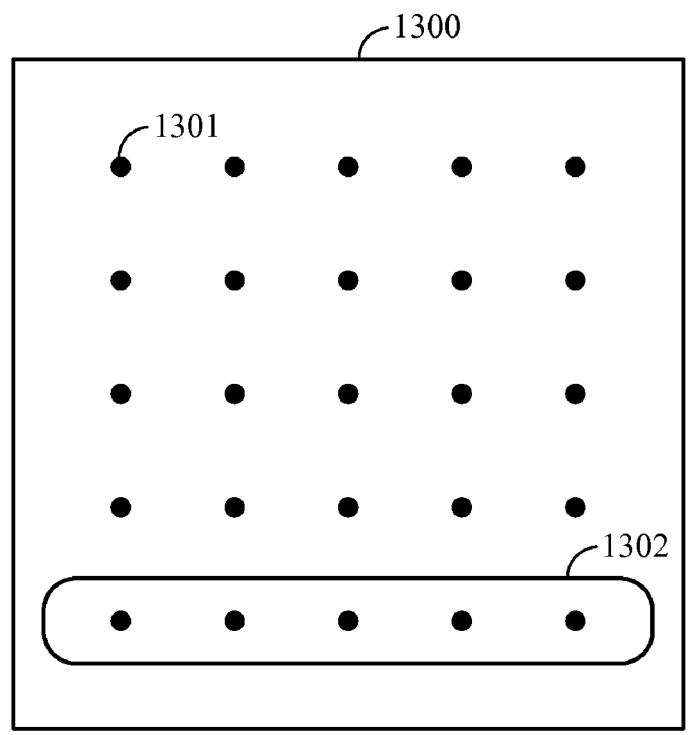
FIG. 13 is an illustration of an exemplary system, adapted according to one embodiment of the disclosure.

An example row swapping technique is shown in FIG. 13, which illustrates a system according to one embodiment of the disclosure. FIG. 13 gives a top down view of the chip 1300, which includes a multitude of TSVs therein, an example of which is TSV 1301. The TSVs in the chip 1300 are arranged in a series of rows, where the row 1302 is a redundant row. When one of the rows in the chip 1300 (or a single TSV within a row) have one or more failures, the signal paths can be rerouted so that the TSVs in the row 1302 are utilized. Such an embodiment is especially useful when manufacturing errors are more likely to cause multiple defects in a single row. The simplest example of this is where the row is proportionally longer than the column.

Figure 14:
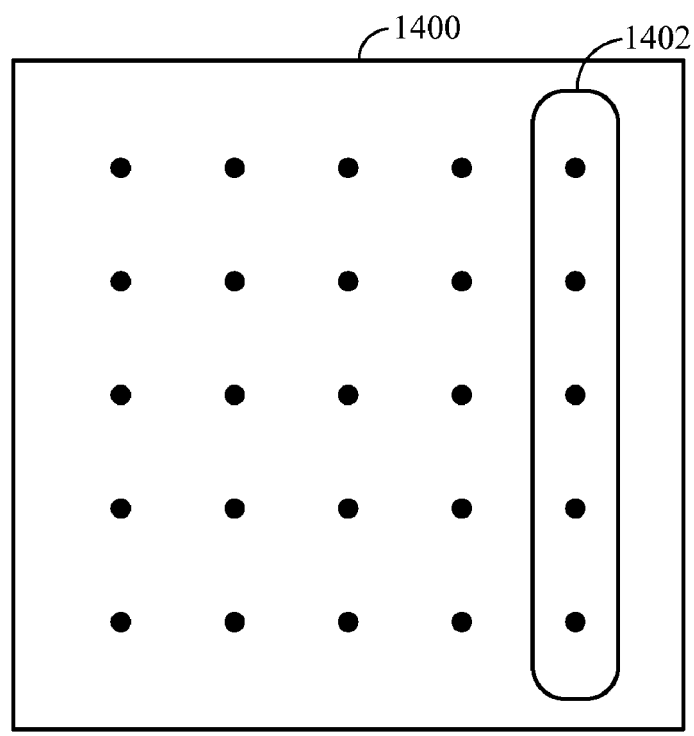
FIG. 14 is an illustration of an exemplary system, adapted according to one embodiment of the disclosure.

An example column swapping technique is shown in FIG. 14, which illustrates a system according to one embodiment of the disclosure. The chip 1400 includes the redundant column 1402, which can be used in a similar way as the redundant row 1302 of FIG. 13. Such an embodiment is especially useful when manufacturing errors are more likely to cause multiple defects to show up in a single column. The simplest example of this is where the column is proportionally longer than the row.

Figure 15:
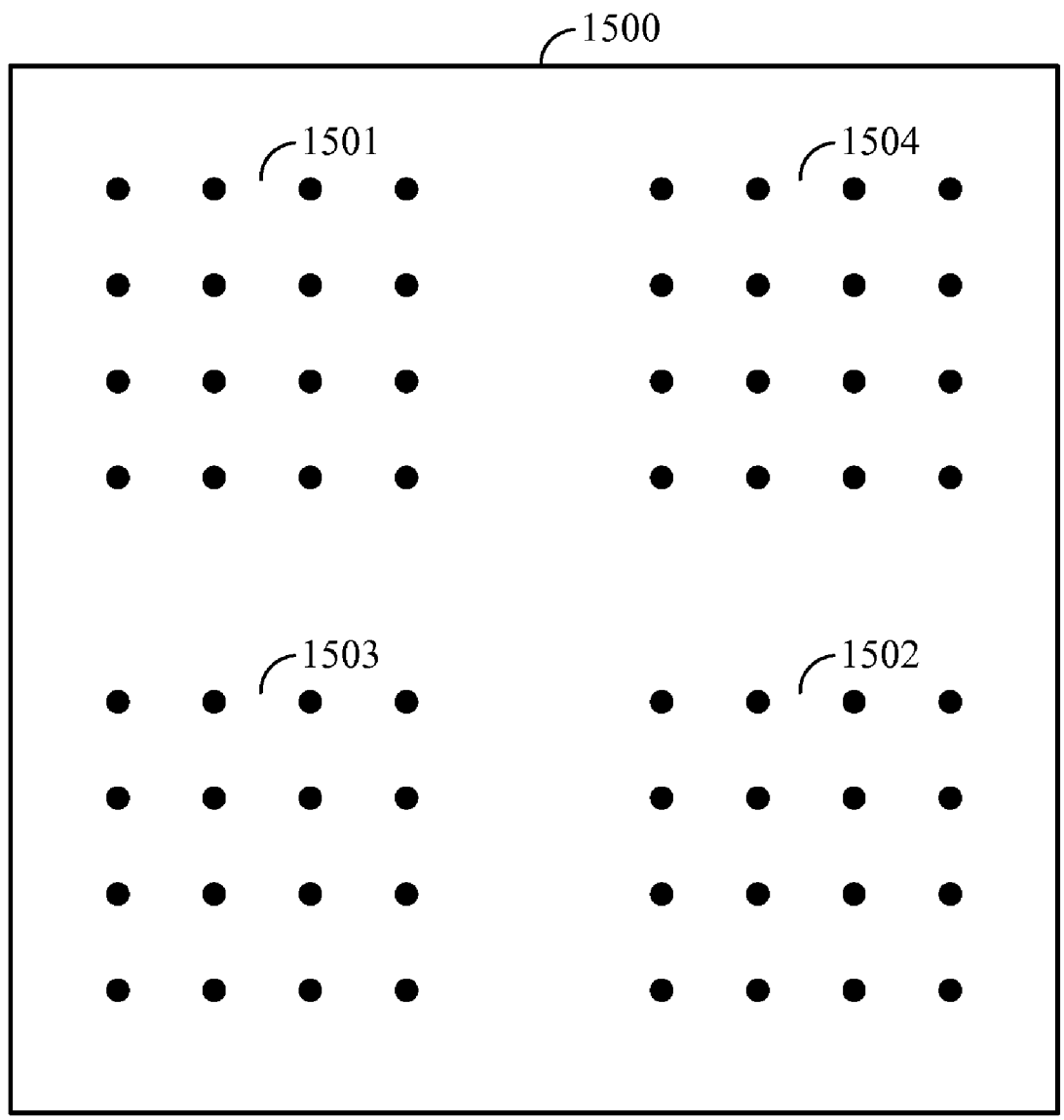
FIG. 15 is an illustration of an exemplary system, adapted according to one embodiment of the disclosure.

FIG. 15 illustrates the chip 1500 adapted according to one embodiment of the disclosure. The chip 1500 includes the primary blocks 1501, 1503, and 1504. The chip 1500 also includes the redundant block 1502, which can be used in a similar way to the redundant row 1302 of FIG. 13, either to replace one of the primary blocks 1501, 1503, 1504 or to be used in parallel with the primary blocks 1501, 1503, 1504.

Additionally or alternatively, various embodiments may implement redundancy in a bus interconnect or set of bus interconnects and/or a port interconnect or set of port interconnects. In fact, various embodiments can use any combination or redundant rows, columns, blocks, regions, arrays, chains, bus, or ports.

Figure 16:
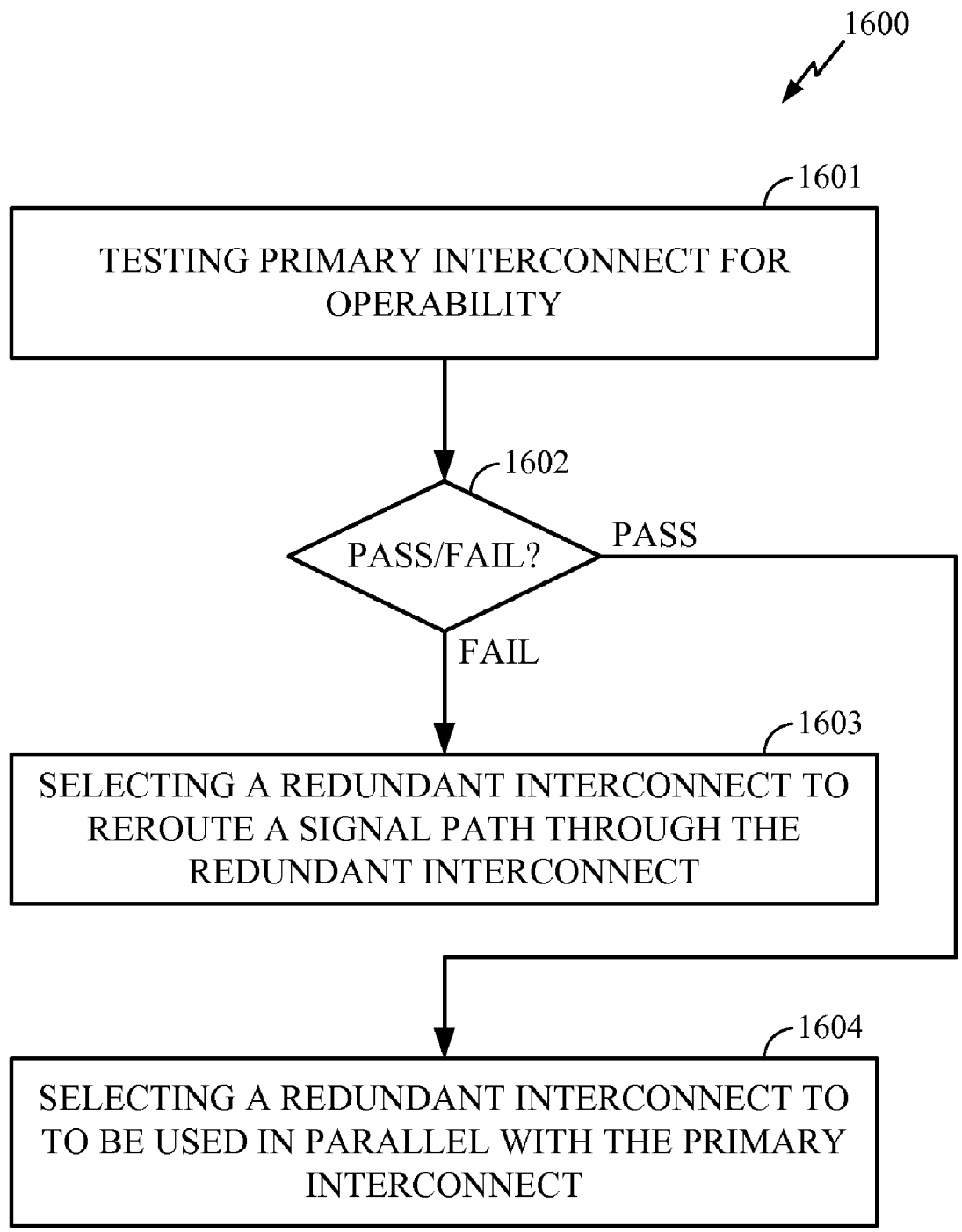
FIG. 16 is an illustration of an exemplary method, adapted according to one embodiment of the disclosure.

As mentioned above, various embodiments of the disclosure include methods for use of redundant interconnects. FIG. 16 is an illustration of the method 1600 adapted according to one embodiment of the disclosure.

In the block 1601, the primary interconnect is tested for operability. Various methods for testing operability are described above and can be applied in some embodiments. For example, one technique includes scanning data from the test processor through boundary scan registers (BSRs), updating them so that the TSV is exposed to the BSR data, capturing the data on the other side of the TSV, and scanning the data back to the test processor.

In the block 1602, it is discerned whether the primary interconnect passes or fails the operability test.

If the primary interconnect fails the operability test, then the method 1600 progresses to the block 1603, where the redundant interconnect is selected. Selecting and rerouting can be performed in any of a variety of ways. In one example, the signal path that would otherwise use the primary interconnect is rerouted through the redundant interconnect, as shown in FIG. 9. In another example, a signal path offsetting technique is used which offsets signal paths in one more primary interconnects to adjacent interconnects, thereby rerouting a signal path to the redundant interconnect, as shown in FIGS. 8A and B.

If it is determined in the block 1602, that the primary interconnect passes the operability test, then the method 1600 progresses to the block 1603. In the block 1603, the redundant interconnect is selected to be used in parallel with the primary interconnect. In one example, the redundant interconnect passes the same signal as is passed through the primary interconnect. In another example, the redundant interconnect passes a different signal than that of the primary interconnect. This approach can be used to increase the bandwidth of the interface.

While the method 1600 is shown above as series of discrete steps, the scope of embodiments is not so limited. Various embodiments add, omit, modify, overlap, or rearrange any of the blocks of the method 1600. For instance, the method 1600 is described with respect to one primary interconnect and one redundant interconnect, but the processes can be applied to systems that include more than one primary interconnect and more than one redundant interconnect. In one example, there are many primary interconnects, which are all tested for operability.

Embodiments of the disclosure can be included in a variety of applications. In one example, a microprocessor includes redundant interconnects between die layers. Logic internal or external to the chip performs testing on the interconnects to discern if any of the interconnects are faulty. If one or more interconnects are faulty, then self-repair is performed by bypassing a faulty interconnect. In another example, the processor is included in a handheld device, such as a mobile phone. Upon boot-up of the handheld device, self test and repair are performed in order to ensure proper functioning of the device. It is possible that as the device ages, some interconnects will become defective, and a redundant interconnect scheme can be used to ensure proper operation for an extended life. Testing and repair can also be performed as part of a manufacturing flow. Furthermore, when no defect exists, redundant interconnects can be used to convey signals in parallel with other interconnects, thereby improving bandwidth. Thus, in one example, when testing reveals that all interconnects of a group of interconnects are properly functioning, then signal paths can be controlled so that one or more redundant interconnects carry signals in parallel with one or more primary interconnects.

Figure 17:
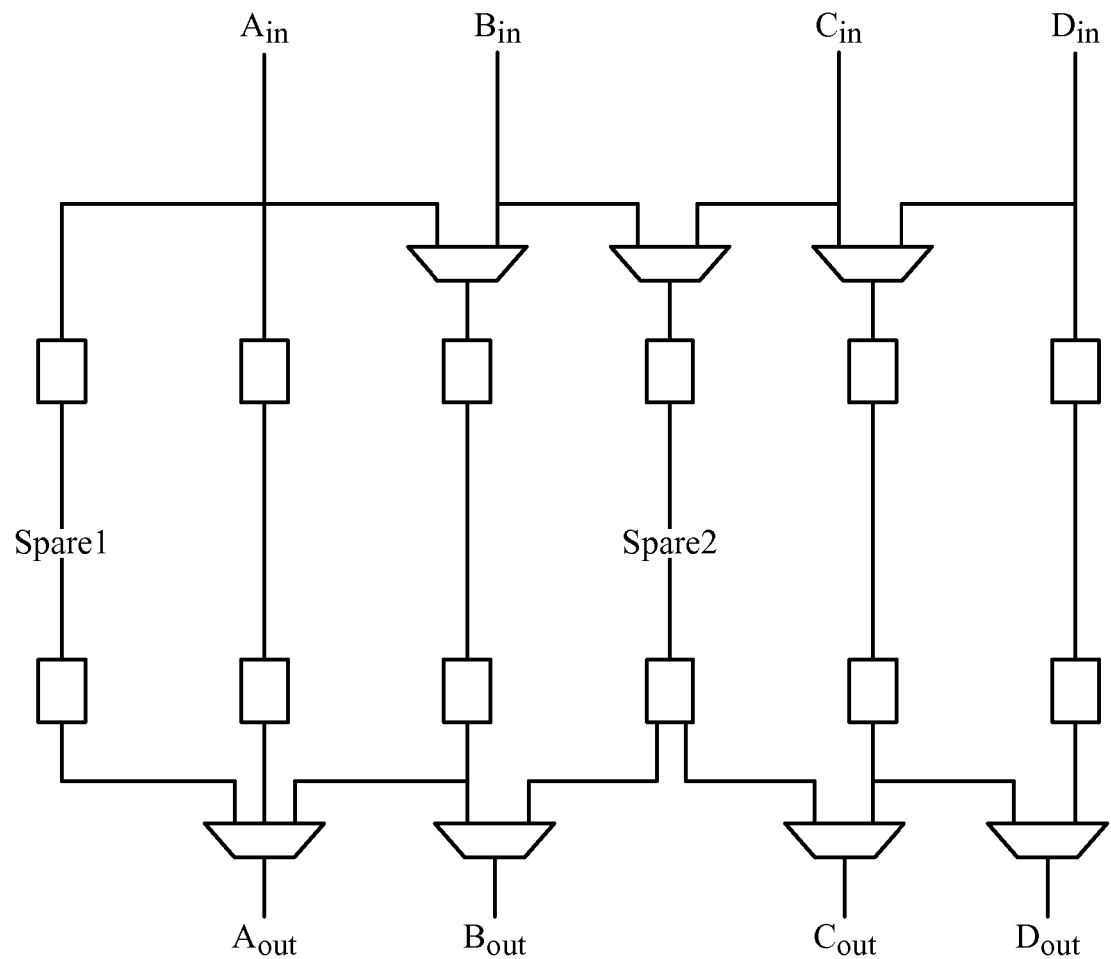
FIGS. 17, 18, and 19 illustrate an example embodiment of the disclosure using a directed graph.
Figure 18:
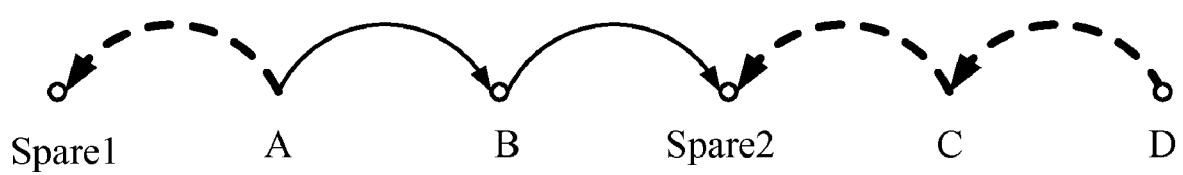
Figure 19:
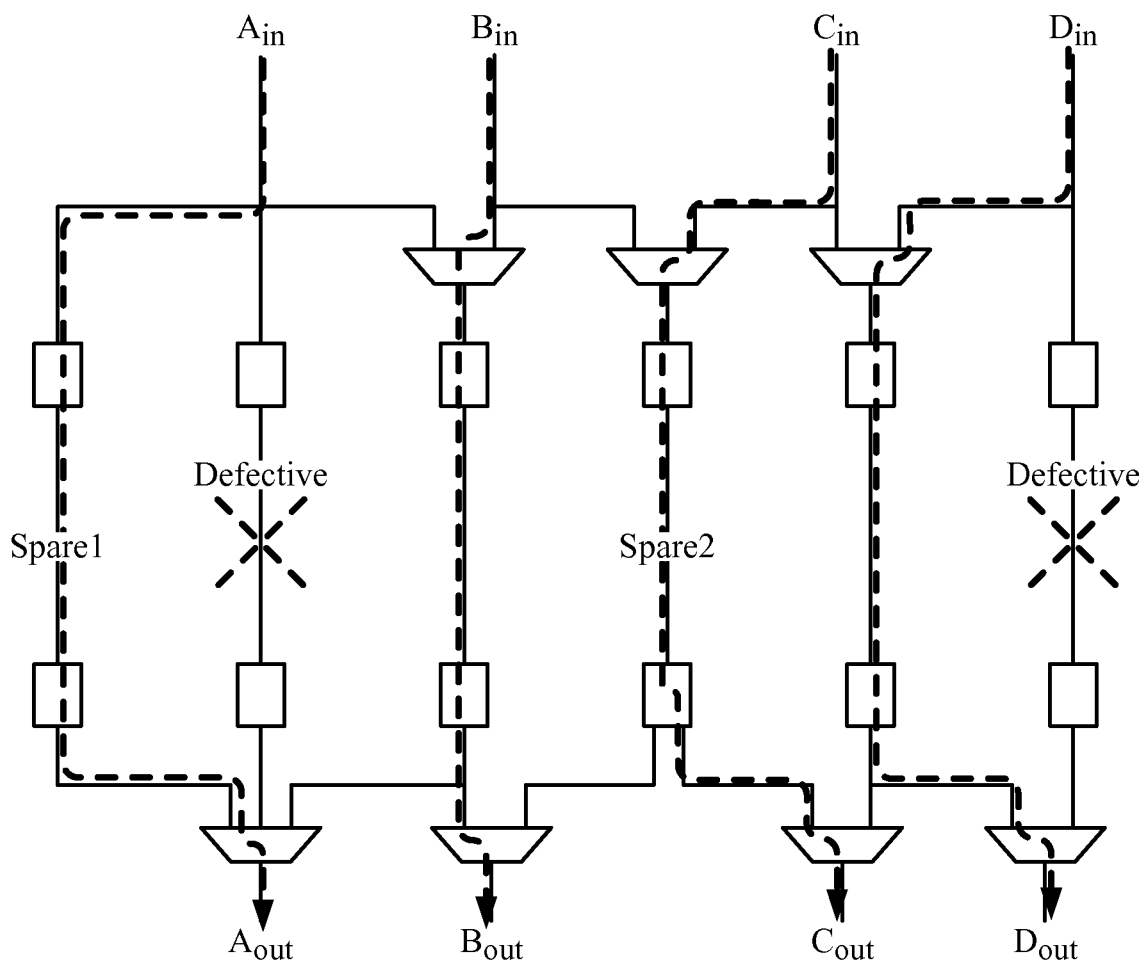

FIGS. 17, 18, and 19 illustrate an example embodiment of the disclosure using a directed graph abstraction. Specifically, FIG. 17 represents a sample system with four functional TSVs (A, B, C, D) and two spare TSVs (spare1 and spare2). FIG. 18 is a directed graph corresponding to FIG. 17, and FIG. 19 shows a technique for repairing the device of FIG. 8 when TSVs A and D fail.

In general, if one constructs a directed graph (e.g., FIG. 18), where each TSV is a vertex and the capability to re-route data from TSV to TSV is represented by a directed edge, then a faulty device is repairable in the scenario when paths that do not share edges or vertices exist from every faulty TSV or via to a redundant TSV or via and the re-routing control hardware is complex enough to support such re-routings simultaneously. If a device is repairable, it can be repaired by re-routing data according to the edges in such paths. This framework covers very complex and varied structures such as those that are able to re-route data in both directions in a line, able to route data in a single or both directions in each dimension of a 2-D layout, able to route data though several neighbors, varied location and frequency of spare TSVs, able to perform non-uniform rerouting, and so on.

In FIG. 17, multiplexor selects are presumed to be controlled directly from persistent storage elements (not depicted). Disjoint paths from A to spare1 and D to spare2 exist in FIG. 18 and are shown in a heavy dashed line. Accordingly to FIG. 18, the device of FIG. 17 with faulty TSVs A and D can be repaired as depicted on FIG. 19.

Figure 20:
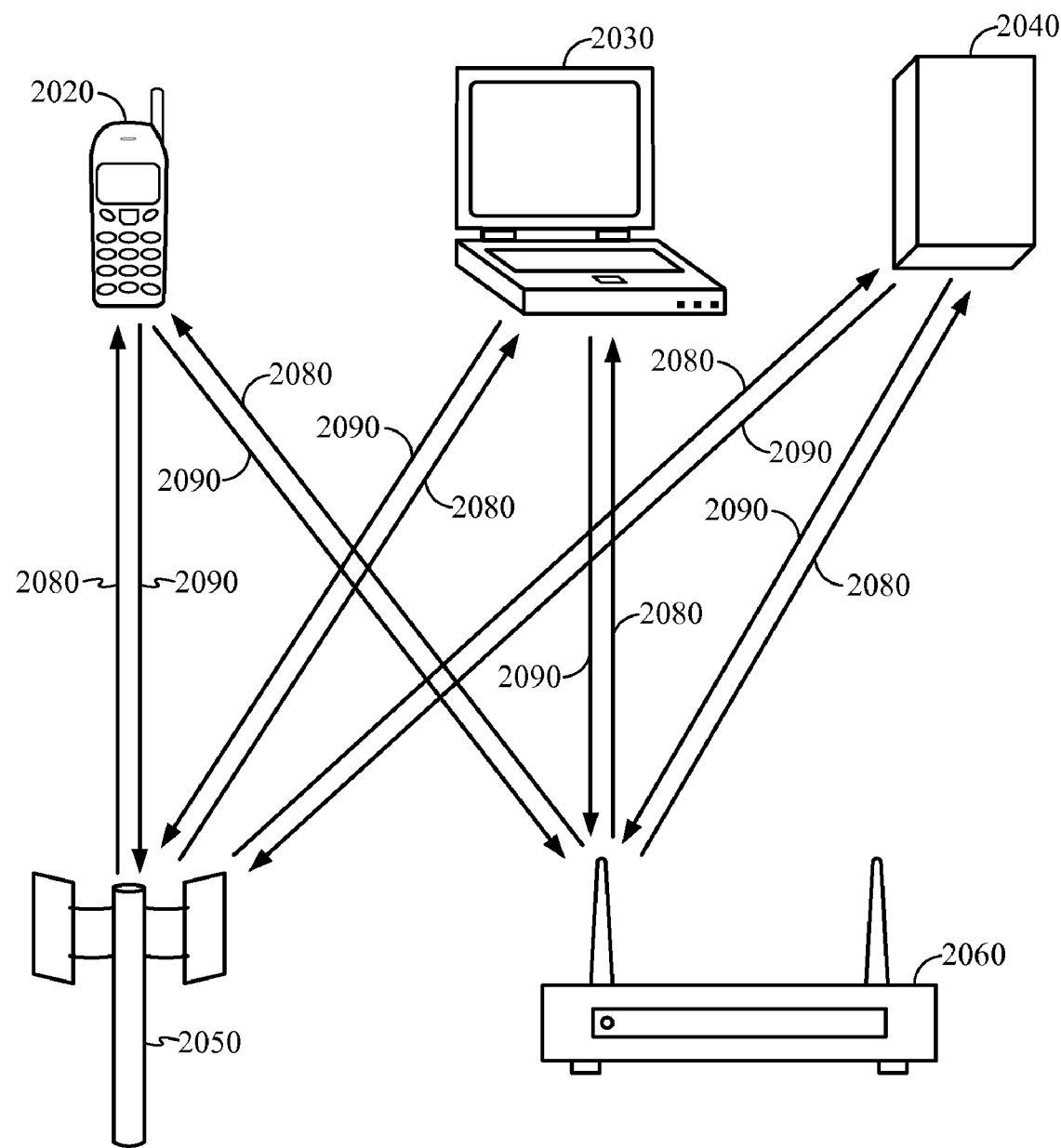
FIG. 20 is an illustration of an exemplary system, adapted according to one embodiment of the disclosure.

FIG. 20 shows an exemplary wireless communication system 2000 in which an embodiment of the disclosure may be advantageously employed. For purposes of illustration, FIG. 20 shows three remote units 2020, 2030, and 2040 and two base stations 2050, 2060. It will be recognized that wireless communication systems may have many more remote units and base stations. The remote units 2020, 2030, and 2040 can include any of a variety of components, for example memory units and processors, that include the disclosed interconnect configuration. FIG. 20 shows forward link signals 2080 from the base stations 2050, 2060 to the remote units 2020, 2030, and 2040 and the reverse link signals 2090 from the remote units 2020, 2030, and 2040 to the base stations 2050, 2060.

Generally, remote units may include cell phones, handheld personal communication systems (PCS) units, portable data units such as personal data assistants, fixed location data units such as meter reading equipment, and/or the like. In FIG. 20, the remote unit 2020 is shown as a mobile telephone, the remote unit 2030 is shown as a portable computer, and the remote unit 2040 is shown as a fixed location remote unit in a wireless local loop system. The base stations 2050, 2060 can be any of a variety of wireless base stations, including, e.g., cellular telephone base stations, wireless network access points (e.g., IEEE 802.11 compliant access points), and the like. Although FIG. 20 illustrates remote units according to the teachings of the disclosure, the disclosure is not limited to these exemplary illustrated units. For example, the wireless communication system could also include a BAN (Body Area Network). Such a BAN may include devices with TSVs or other high density interconnects. Any interconnect failure could immediately be reported to other units in the system.

Although specific circuitry has been set forth, it will be appreciated by those skilled in the art that not all of the disclosed circuitry is required to practice the disclosure. Moreover, certain well known circuits have not been described, to maintain focus on the disclosure. Similarly, although the description refers to logical "0" and logical "1" in certain locations, one skilled in the art appreciates that the logical values can be switched, with the remainder of the circuit adjusted accordingly, without affecting operation of the present disclosure.

Although the term "through silicon via" is used, the disclosure is not limited to silicon. Rather, the disclosure relates to any type of semiconductor material.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An integrated circuit (IC) comprising:
   a plurality of primary interconnects and a redundant interconnect, each of the plurality of primary interconnects being configured to convey a signal of another primary interconnect; and
   selection circuitry coupling the plurality of primary interconnects and the redundant interconnect and being configured to offset a first signal path from a defective primary interconnect to an operative one of the plurality of primary interconnects and to also offset a second signal path from the operative one of the plurality of interconnects to the redundant interconnect to bypass the defective primary interconnect.

2. The integrated circuit (IC) of claim 1 further comprising:
an error detection module configured to detect presence of an error in the defective primary interconnect.

3. The integrated circuit (IC) of claim 2 wherein said error detection module selects said redundant interconnect in response to detection of said error.

4. The integrated circuit (IC) of claim 1 wherein each primary interconnect and the redundant interconnect are selected from a list consisting of:
at least one through substrate via;
at least one bond wire; and
at least one routing route through a redistribution layer (RDL).

5. The integrated circuit (IC) of claim 1 wherein each primary interconnect and said redundant interconnect extend from a first semiconductor active die layer through a first semiconductor substrate thereby coupling said first semiconductor active die layer to a second semiconductor active die layer.

6. The integrated circuit (IC) of claim (IC) further comprising:
a first array of 2:1 input multiplexers, said first array including at least one 2:1 multiplexer coupled to each of the plurality of primary interconnects, the first array configured so that each multiplexer of the first array is associated with one of the plurality of primary interconnects; and
logic controlling the first array of input multiplexers to shift a signal path from a first one of the plurality of primary interconnects to an adjacent one of the plurality of primary interconnects.

7. The integrated circuit (IC) of claim 6 further comprising:
a second array of 2:1 input multiplexers, said second array including at least one 2:1 multiplexer for each 2:1 multiplexer of said first array and for another redundant interconnect; and
logic controlling said second array of input multiplexers to shift a signal path from a first 2:1 multiplexer of said first array to an adjacent 2:1 multiplexer of said first array.

8. The integrated circuit (IC) of claim 1 further comprising:
a first input multiplexer, the first input multiplexer receiving a plurality of inputs, each of the inputs corresponding to one of the plurality of primary interconnects, an output of the first input multiplexer coupled to the redundant interconnect; and
logic controlling the first input multiplexer to shift a signal path from a first one of the plurality of primary interconnects to the redundant interconnect.

9. The integrated circuit (IC) of claim 1 wherein said integrated circuit is included in an item selected from the list consisting of:
a handheld communication device; and
a body area network (BAN).

10. The integrated circuit (IC) of claim 1 wherein said circuit selecting said redundant interconnect further comprises:
a fuse permanently selecting said redundant interconnect.

11. The integrated circuit of claim 1, integrated into of a cell phone, a portable computer, a hand-held personal communication systems (PCS) unit, a portable data unit, a personal data assistant and/or a fixed location data unit.

12. A system comprising:
a plurality of primary interconnects and a redundant interconnect, each of the plurality of primary interconnects being configured to convey a signal of another primary interconnect;
a module configured to test for operability of each primary interconnect; and
circuitry configured to offset a first signal path from a defective primary interconnect to an operative one of the plurality of primary interconnects and also to offset a second signal path from the operative one of the plurality of interconnects to the redundant interconnect in parallel with the operative one of the primary interconnect to bypass the defective primary interconnect when a result of the testing indicates defective operability of a tested primary interconnect.

13. The system of claim 12 wherein said circuitry comprises:
at least one input multiplexer and at least one output multiplexer defining a first signal path through one of the plurality of primary interconnects and a second signal path through one of a different one of the plurality of primary interconnects and the redundant interconnect.

14. The system of claim 13 wherein said circuitry further comprises:
a memory element receiving at least one control signal and controlling outputs of said at least one input multiplexer and said at least one output multiplexer.

15. The system of claim 12, integrated into a cell phone, a portable computer, a hand-held personal communication systems (PCS) unit, a portable data unit, a personal data assistant and/or a fixed location data unit.

16. A method for use in a system including a plurality of primary interconnects and a redundant interconnect, each of the plurality of primary interconnects being capable of conveying a signal of another primary interconnect, and circuitry coupling the plurality of primary interconnects and the redundant interconnect, the circuitry being configured to offset a signal path to at least one of the plurality of primary interconnects and also the redundant interconnect, the method comprising:
testing one of the plurality of primary interconnects for operability;
through the testing, discerning a failure in the tested primary interconnect to identify a defective primary interconnect;
offsetting a first signal path from the defective primary interconnect to an operative one of the plurality of primary interconnects; and
selecting the redundant interconnect to reroute a second signal path to bypass the defective primary interconnect.

17. The method of claim 16 wherein the plurality of primary interconnects are arranged in a first region in a semiconductor chip, and wherein said redundant interconnect is one of a plurality of redundant interconnects arranged in a second region in a semiconductor chip, wherein selecting said redundant interconnect comprises:
selecting said second region to bypass said first region.

18. The method of claim 16 wherein said first and second regions comprise items selected from the list consisting of:
rows; and
columns.

19. The method of claim 16 wherein testing said primary interconnect for operability comprises:
passing test data across said primary interconnect and another interconnect; and
detecting presence of a defect in said primary interconnect by evaluating the test data passed across each interconnect using one or more items selected from the list consisting of:
error correction code (ECC);
error detection code (EDC): and
a voting algorithm.

20. The method of claim 16 wherein said testing said primary interconnect for operability is performed at power-up of a mobile device.

21. The method of claim 16, further comprising integrating the system into a cell phone, a portable computer, a hand-held personal communication systems (PCS) unit, a portable data unit, a personal data assistant and/or a fixed location data unit.

22. A method for use in a system including a plurality of primary interconnects and a redundant interconnect, each of the plurality of primary interconnects being capable of conveying a signal of another primary interconnect, and circuitry coupling the plurality of primary and redundant interconnects, the circuitry being configured to offset a signal path to at least one of the plurality of primary interconnects and also the redundant interconnect, the method comprising:
    testing one of the plurality of primary interconnects for operability;
    through the testing, discerning defective operability of a primary interconnect;
    offsetting a signal path from the defective primary interconnect to an operative one of the plurality of primary interconnects; and
    selecting the redundant interconnect to be used in parallel with the operative primary interconnect to carry a signal to bypass the defective primary interconnect.

23. The method of claim 22 wherein said testing said primary interconnect for operability is performed during operation of a mobile device.

24. The method of claim 22 wherein said testing said primary interconnect for operability is performed during manufacture of a mobile device.

25. The method of claim 22 further comprising:
    passing a same signal through said redundant interconnect and said primary interconnect for operability.

26. The method of claim 22, further comprising integrating the system into a cell phone, a portable computer, a hand-held personal communication systems (PCS) unit, a portable data unit, a personal data assistant and/or a fixed location data unit.

27. An integrated circuit (IC) comprising:
    a plurality of primary coupling means and a redundant coupling means, each of the plurality of primary coupling means configured to convey a signal of another primary coupling means; and
    means for coupling the plurality of primary coupling means and the redundant coupling means being configured to offset a first signal path from a defective primary coupling means to an operative one of the plurality of primary coupling means and also to offset a second signal path from the operative one of the plurality of interconnects to the redundant coupling means to bypass the defective primary coupling means.

28. The integrated circuit (IC) of claim 27 further comprising:
    means for testing operability of the primary coupling means; and
    means for rerouting a signal path associated with the primary coupling means through said redundant coupling means.

29. The integrated circuit (IC) of claim 27 further comprising:
    means for testing operability of the primary coupling means; and
    means for selecting the redundant coupling means used in parallel with the primary coupling means in response to results of the testing means.

30. The integrated circuit of claim 27, integrated into a cell phone, a portable computer, a hand-held personal communication systems (PCS) unit, a portable data unit, a personal data assistant and/or a fixed location data unit.

31. A system comprising:
    a plurality of primary interconnects and a redundant interconnect, each of the plurality of primary interconnects being configured to convey a signal of another primary interconnect;
    means for testing for operability of each primary interconnect; and
    means for offsetting a first signal path from a defective primary interconnect to an operative one of the plurality of primary interconnects and for offsetting a second signal path from the operative one of the plurality of primary interconnects to the redundant interconnect used in parallel with the operative one of the primary interconnects to bypass the defective primary interconnect when a result of the testing indicates a tested primary interconnect is defective.

32. The system of claim 31, integrated into a cell phone, a portable computer, a hand-held personal communication systems (PCS) unit, a portable data unit, a personal data assistant and/or a fixed location data unit.

* * * * *